(12) United States Patent
Nakahara et al.

(10) Patent No.: US 10,547,170 B2
(45) Date of Patent: Jan. 28, 2020

(54) SEMICONDUCTOR DEVICE

(71) Applicant: Renesas Electronics Corporation, Tokyo (JP)

(72) Inventors: Akihiro Nakahara, Tokyo (JP); Makoto Tanaka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 280 days.

(21) Appl. No.: 15/496,275

(22) Filed: Apr. 25, 2017

(65) Prior Publication Data
US 2017/0346274 A1    Nov. 30, 2017

(30) Foreign Application Priority Data

May 24, 2016  (JP) .................................. 2016-103174

(51) Int. Cl.
| | |
|---|---|
| *H02H 9/04* | (2006.01) |
| *H02H 3/20* | (2006.01) |
| *H03K 17/14* | (2006.01) |
| *H03K 17/082* | (2006.01) |
| *H03K 17/687* | (2006.01) |
| *G05F 1/56* | (2006.01) |
| *H02H 7/125* | (2006.01) |

(52) U.S. Cl.
CPC ................ *H02H 3/20* (2013.01); *H02H 9/04* (2013.01); *H03K 17/0822* (2013.01); *H03K 17/145* (2013.01); *H03K 17/687* (2013.01); *G05F 1/562* (2013.01); *H02H 7/1252* (2013.01); *H02H 9/041* (2013.01)

(58) Field of Classification Search
USPC ..................................... 361/86–87, 93.7–93.9
See application file for complete search history.

(56) References Cited

U.S. PATENT DOCUMENTS

| 7,310,006 B2 | 12/2007 | Shimada | |
|---|---|---|---|
| 2002/0181180 A1* | 12/2002 | Ivanov | H03F 1/523 361/93.9 |

(Continued)

FOREIGN PATENT DOCUMENTS

| JP | 2000-200902 A | 7/2000 |
|---|---|---|
| JP | 2006-148323 A | 6/2006 |
| JP | 2010-093434 A | 4/2010 |

OTHER PUBLICATIONS

Japanese Notice of Reasons for Refusal issued in corresponding Japanese Patent Application No. 2016-103174, dated Aug. 20, 2019, with English translation.

*Primary Examiner* — Danny Nguyen
(74) *Attorney, Agent, or Firm* — McDermott Will & Emery LLP

(57) ABSTRACT

A semiconductor device according to related art has a problem that a clamp voltage that clamps an output voltage cannot adaptively vary in accordance with a power supply voltage, and it is thus not possible to reduce heating of a semiconductor chip to a sufficiently low level. According to one embodiment, a semiconductor device includes a drive circuit (10) that controls on and off of an output transistor (13) and an overvoltage protection circuit (12) that controls a conductive state of the output transistor (13) when an output voltage Vout reaches a clamp voltage, and the overvoltage protection circuit (12) has a circuit structure that sets the clamp voltage to vary in proportion to a power supply voltage VDD.

14 Claims, 21 Drawing Sheets

(56) References Cited

U.S. PATENT DOCUMENTS

| | | | | |
|---|---|---|---|---|
| 2010/0079920 A1* | 4/2010 | Fanic | ............... | H03K 17/0822 |
| | | | | 361/56 |
| 2012/0236456 A1* | 9/2012 | Yu | ............... | H03K 17/0822 |
| | | | | 361/91.1 |
| 2015/0364913 A1* | 12/2015 | Minoya | ............... | H02H 9/025 |
| | | | | 361/93.9 |

* cited by examiner (BASIC FORM OF FIRST EMBODIMENT)

(FIRST MODIFIED EXAMPLE OF FIRST EMBODIMENT)

(SECOND MODIFIED EXAMPLE OF FIRST EMBODIMENT)

SEMICONDUCTOR DEVICE

CROSS-REFERENCE TO RELATED APPLICATIONS

This application is based upon and claims the benefit of priority from Japanese patent application No. 2016-103174, filed on May 24, 2016, the disclosure of which is incorporated herein in its entirety by reference.

BACKGROUND

The present invention relates to a semiconductor device and, for example, to a semiconductor device with an active clamp circuit.

A semiconductor device called IPD (Intelligent Power Device) which includes a high-side switch or a low-side switch that switches between supply and cutoff of a current to a load circuit and which turns the high-side switch or the low-side switch on and off in accordance with conditions is used. In the case where an inductive load such as a solenoid is included in a load circuit that is controlled by the IPD, when a current supplied to the load circuit is cut off by the IPD, an output voltage that is generated at a node that connects the IPD and the load circuit becomes higher than a power supply voltage in some cases. In order to prevent the breakdown of the IPD due to such an increase in the output voltage, a dynamic clamp circuit that limits an increase in the output voltage to a certain level is included in the IPD. An example of a semiconductor device that includes such a dynamic clamp circuit is disclosed in Japanese Unexamined Patent Publication No. 2000-200902.

In the semiconductor device that is described in Japanese Unexamined Patent Publication No. 2000-200902, a buffer is connected to a control input terminal, and the output of the buffer is input to the gate of an n-channel power MOS transistor through a resistor. Further, in the semiconductor device described in Japanese Unexamined Patent Publication No. 2000-200902, a load device is connected to a drain electrode of the n-channel power MOS transistor. In the semiconductor device described in Japanese Unexamined Patent Publication No. 2000-200902, a plurality of constant voltage diodes are connected in series, a cathode terminal of the last diode is connected to a drain electrode of the n-channel power MOS transistor 42, an anode terminal of the top diode of the plurality of constant voltage diodes connected in series is connected to an anode terminal of a general diode, and a cathode terminal of the general diode is connected to one end of the resistor and a gate electrode of the n-channel power MOS transistor.

SUMMARY

However, in the semiconductor device that is described in Japanese Unexamined Patent Publication No. 2000-200902, a clamp voltage is set by a diode that is connected between a gate and a drain of the n-channel power MOS transistor. Therefore, the semiconductor device described in Japanese Unexamined Patent Publication No. 2000-200902 has a problem that a clamp voltage is constant regardless of an increase or decrease in a power supply voltage, and it is thus not possible to reduce the junction temperature of the semiconductor device to a sufficiently low level.

The other problems and novel features of the present invention will become apparent from the description of the specification and the accompanying drawings.

According to one embodiment, a semiconductor device includes a drive circuit that controls on and off of an output transistor, and an overvoltage protection circuit that controls a conductive state of the output transistor when an output voltage reaches a clamp voltage, and the overvoltage protection circuit has a circuit structure that sets the clamp voltage to vary in proportion to a power supply voltage.

According to the one embodiment, it is possible to provide a semiconductor device where the junction temperature can be sufficiently lowered regardless of the level of a power supply voltage.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
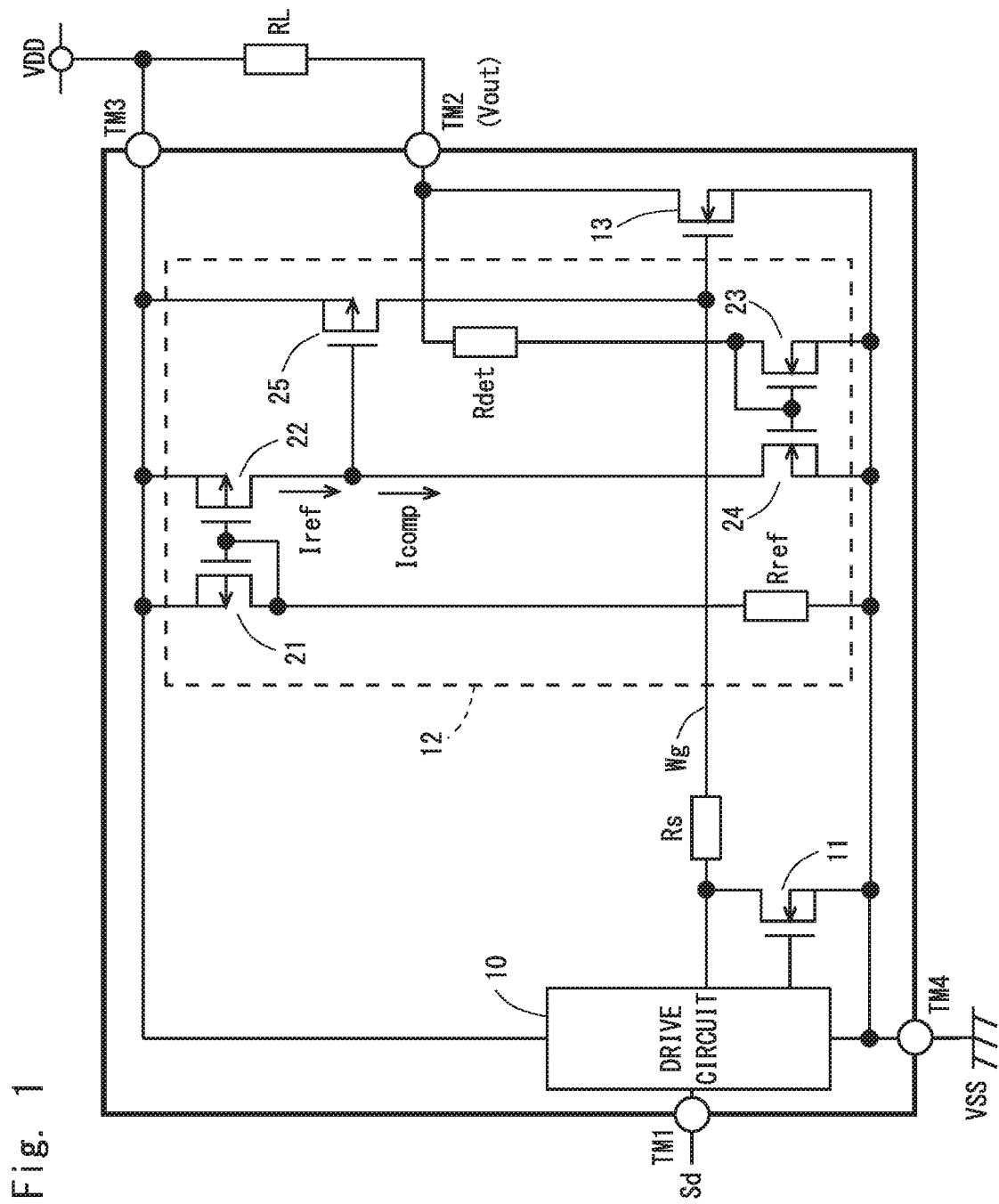
FIG. 1 is a block diagram of a semiconductor device according to a first embodiment.

The following description and the attached drawings are appropriately shortened and simplified to clarify the explanation. Further, in the drawings, the same elements are denoted by the same reference symbols and redundant description thereof is omitted as appropriate.

FIG. 1 shows a block diagram of a semiconductor device 1 according to a first embodiment. The semiconductor device 1 according to the first embodiment is a low-side switch that switches whether or not to supply a ground voltage VSS to a load circuit RL. Further, the load circuit RL to be controlled by the semiconductor device 1 according to the first embodiment includes an inductive load, a back electromotive force is generated when switching from the state of supplying the ground voltage to the state of cutting off the ground voltage, and an output voltage Vout becomes higher than a power supply voltage due to the back electromotive force.

As shown in FIG. 1, the semiconductor device 1 according to the first embodiment includes a drive circuit 10, a discharge circuit 11, a current limiting resistor Rs, an overvoltage protection circuit 12, and an output transistor 13. The semiconductor device 1 according to the first embodiment is an example where the output transistor 13 is formed on the same semiconductor substrate as the drive circuit 10, the discharge circuit 11 and the overvoltage protection circuit 12. Further, the semiconductor device 1 according to the first embodiment has an input terminal TM1, an output terminal TM2, a first power supply terminal (e.g., power supply terminal TM3), and a second power supply terminal (e.g., ground terminal TM4). In the semiconductor device 1 according to the first embodiment, the output terminal TM2 is used also as an output voltage detection terminal for the overvoltage protection circuit 12 to detect an output voltage.

The drive circuit 10 outputs a drive signal for controlling the output transistor. The drive signal is generated based on a drive control signal Sd that is output from an arithmetic circuit such as MCU (Micro Controller Unit), which is not shown. In the example shown in FIG. 1, the drive control signal Sd is input to the drive circuit 10 through the input terminal TM1. The drive signal is high level when the drive control signal Sd is high level, and it is low level when the drive control signal Sd is low level. In the example of FIG. 1, the drive circuit 10 supplies the drive signal to the output transistor 13 through the current limiting resistor Rs that is placed on a gate wire Wg.

The discharge circuit 11 is connected between the gate wire Wg and the source of the output transistor 13. To be specific, the discharge circuit 11 has an NMOS transistor whose drain is connected to a part of the gate wire Wg which is between the current limiting resistor Rs and the drive circuit 10, source is connected to a ground line, and gate is supplied with a control signal that is output from the drive circuit 10. Then, the discharge circuit 11 is controlled to be conductive when the drive circuit 10 turns off the output transistor 13.

The output transistor 13 is connected between the other end of the load circuit RL and the ground terminal TM4. In the example shown in FIG. 1, because the output transistor 13 is included in the semiconductor device 1, the load circuit RL is connected to the output transistor 13 through the output terminal TM2. The gate wire Wg is connected to the gate of the output transistor 13. In the semiconductor device 1 according to the first embodiment, an NMOS transistor whose source is connected to the ground terminal TM4 and drain is connected to the output terminal TM2 is used as the output transistor 13.

The overvoltage protection circuit 12 controls the output transistor 13 based on a voltage difference between the ground terminal TM4 and the output terminal TM2. To be specific, in the state when the output transistor 13 is controlled to be cut off, the overvoltage protection circuit 12 controls the output transistor 13 to be conductive when a voltage difference between the ground terminal TM4 and the output terminal TM2 reaches a clamp voltage Vclmp that is set to be proportional to a voltage difference (e.g., power supply voltage VDD) between a first power supply (e.g., power supply voltage VDD) and a second power supply (e.g., ground voltage VSS). The clamp voltage Vclmp is set to a voltage when a voltage difference between the ground terminal TM4 and the output terminal TM2 becomes approximately twice the power supply voltage VDD. In the semiconductor device 1 according to the first embodiment, the clamp voltage Vclmp is set to approximately twice the power supply voltage VDD.

The overvoltage protection circuit 12 includes a first current source, a second current source, and an overvoltage protection transistor 25. In the semiconductor device 1 according to the first embodiment, a PMOS transistor is used as the overvoltage protection transistor 25. The first current source generates a reference current Iref which is proportional to the power supply voltage VDD. The second current source generates a comparative current Icomp based on a voltage difference (e.g., output voltage Vout) between the ground terminal TM4 and the output terminal TM2. The overvoltage protection transistor 25 supplies, to the gate wire Wg, an overvoltage protection current which is dependent on a current difference between the reference current Iref and the comparative current Icomp. The reference current Iref is set to be approximately twice the comparative current Icomp in the state where the output voltage Vout is equal to the power supply voltage VDD.

The first current source includes a first transistor (e.g., PMOS transistor 21), a second transistor (e.g., PMOS transistor 22), and a reference current setting resistor Rref. One end of the reference current setting resistor Rref is connected to the ground terminal TM4. The drain of the PMOS transistor 21 is connected to the other end of the reference current setting resistor Rref, the source is connected to the power supply terminal TM3, and the gate and the drain are connected to each other. The source of the PMOS transistor 22 is connected to the power supply terminal TM3, the drain is connected to the gate of the overvoltage protection transistor 25, and the gate is connected in common to the gate of the PMOS transistor 21.

The PMOS transistor 21 and the PMOS transistor 22 form a current mirror circuit. A current obtained by dividing a result of subtracting a threshold voltage Vth of the PMOS transistor 21 from the power supply voltage VDD by a reference current setting resistance Rref flows into the PMOS transistor 21, and the PMOS transistor 22 mirrors a current that flows through the PMOS transistor 21 and outputs it as the reference current Iref. Thus, the reference current Iref has a value of (VDD−Vth)/Rref.

The second current source includes a third transistor (e.g., NMOS transistor 23), a fourth transistor (e.g., NMOS transistor 24), and a comparative current setting resistor Rdet. One end of the comparative current setting resistor Rdet is connected to the output terminal TM2. The drain of the NMOS transistor 23 is connected to the other end of the comparative current setting resistor Rdet, the source is connected to the ground terminal TM4, and the gate and the drain are connected to each other. The source of the NMOS transistor 24 is connected to the ground terminal TM4, the drain is connected to the gate of the overvoltage protection transistor 25, and the gate is connected in common to the gate of the NMOS transistor 23.

The NMOS transistor 23 and the NMOS transistor 24 form a current mirror circuit. A current obtained by dividing a result of subtracting a threshold voltage Vth of the NMOS transistor 23 from the output voltage Vout by a comparative current setting resistance Rdet flows into the NMOS transistor 23, and the NMOS transistor 24 mirrors a current that flows through the NMOS transistor 23 and outputs it as the comparative current Icomp. Thus, the comparative current Icomp has a value of (Vout−Vth)/Rdet.

In the overvoltage protection circuit 12, the PMOS transistor 22 and the NMOS transistor 24 form a current comparator. The same current flows through the two transistors that form the current comparator by Kirchhoff's law. Accordingly, when the values of the reference current Iref and the comparative current Icomp are different, a voltage at the gate of the overvoltage protection transistor 25 changes to the operating point where the same current flows through the two transistors that form the current comparator. In other words, the gate of the overvoltage protection transistor 25 which serves as the output node of the current comparator varies by a result of comparison between those currents.

A drain-source impedance of the overvoltage protection transistor 25 is controlled in accordance with a current comparison result by the current comparator. To be specific, when the gate voltage of the overvoltage protection transistor 25 is high, the gate-source voltage of the overvoltage protection transistor 25 decreases, and the drain-source impedance of the overvoltage protection transistor 25 increases. On the contrary, when the gate voltage of the overvoltage protection transistor 25 is low, the gate-source voltage of the overvoltage protection transistor 25 increases, and the drain-source impedance of the overvoltage protection transistor 25 decreases.

The overvoltage protection transistor 25 controls the gate voltage of the output transistor 13. When the drain-source impedance of the overvoltage protection transistor 25 increases, the gate-source voltage of the output transistor 13 decreases due to a gate discharge of the discharge circuit 11. On the contrary, when the drain-source impedance of the overvoltage protection transistor 25 decreases, a charge current from the overvoltage protection transistor 25 to the gate-source capacitance of the output transistor 13 exceeds a gate discharge of the discharge circuit 11, and the gate-source voltage of the output transistor 13 increases.

By the operation described above, the overvoltage protection circuit 12 performs feedback control of the output voltage Vout as a whole. Specifically, when the reference current Iref is higher than the comparative current Icomp, the gate-source voltage of the output transistor 13 decreases, and the drain-source voltage of the output transistor 13 increases (in other words, the output voltage Vout increases). When, on the other hand, the reference current Iref is lower than the comparative current Icomp, the gate-source voltage of the output transistor 13 increases, and the drain-source voltage of the output transistor 13 decreases (in other words, the output voltage Vout decreases). Then, the output voltage Vout is clamped at the operating point where the reference current Iref and the comparative current Icomp becomes the same. The output voltage when it is clamped in this manner is the clamp voltage Vclmp.

The clamp voltage Vclmp in the semiconductor device 1 according to the first embodiment is described hereinafter. In the semiconductor device 1 according to the first embodiment, the clamp voltage Vclmp is set so that a junction temperature Tj of a semiconductor chip when the output voltage Vout increases due to the back electromotive force of the load circuit RL becomes the lowest. The clamp voltage Vclmp at which the junction temperature Tj becomes the lowest can be obtained by the following calculation.

A clamp time tclmp by the overvoltage protection circuit 12 can be obtained by the following equation (1).

[equation 1]

$$tclmp = \frac{Vclmp}{Vclmp - VDD} LIpeak \quad (1)$$

In the equation (1), Vclmp is the clamp voltage Vclmp, VDD is the power supply voltage, L is the inductance of the inductive load in the load circuit RL, Ipeak is the value of a current flowing through the output transistor 13 at the initial stage of the clamp operation. Note that the characters in the following mathematical expressions represent the same meaning as above.

Further, an energy E that is consumed in the output transistor 13 during the clamp period can be obtained by the following equation (2).

[equation 2]

$$E = \frac{1}{2} \frac{Vclmp}{Vclmp - VDD} LIpeak^2 \quad (2)$$

Figure 2:
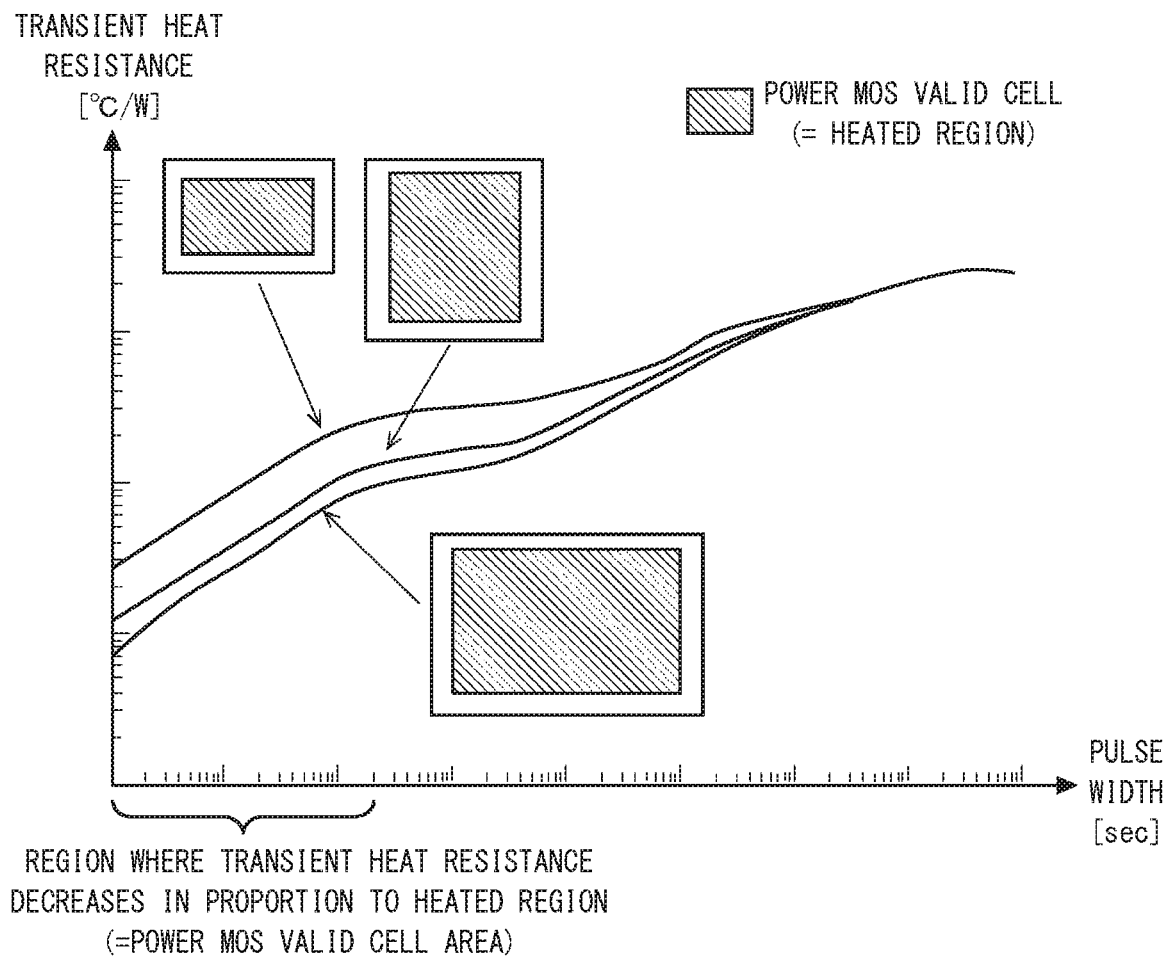
FIG. 2 is a graph showing transient heat characteristics of a semiconductor chip.

In the dynamic clamp operation by the overvoltage protection circuit 12, the clamp time is a time when heat generated at the junction part propagates through the chip. FIG. 2 shows a graph showing the transient heat resistance characteristics of the semiconductor chip. As shown in FIG. 2, when the pulse width (=time) of heat transfer in the chip is the same, the transient heat resistance decreases in proportion to the chip area. The characteristic formula of a transient heat resistance Zth in the time region of heat transfer in the chip can be represented by the following equation (3).

[equation 3]

$$Zth = \alpha \frac{\sqrt{tclmp}}{S} \quad (3)$$

In the above equation (3), α is a proportionality coefficient, and S is a heated area of the output transistor.

A temperature rise ΔT of the semiconductor chip can be calculated by the product of a transient heat resistance and a consumed power. An equation to calculate the temperature rise ΔT is represented as the following equation (4).

[equation 4]

$$\Delta T = Zth \frac{E}{tclmp} = \alpha \frac{\sqrt{\frac{LIpeak}{Vclmp - VDD}}}{S} \times \frac{Vclmp \times Ipeak}{2} \quad (4)$$

From the equation (4), the temperature rise ΔT of the semiconductor chip has the relationship of the following equation (5).

[equation 5]

$$\Delta T = \propto \frac{Vclmp}{\sqrt{Vclmp - VDD}} \quad (5)$$

Figure 3:
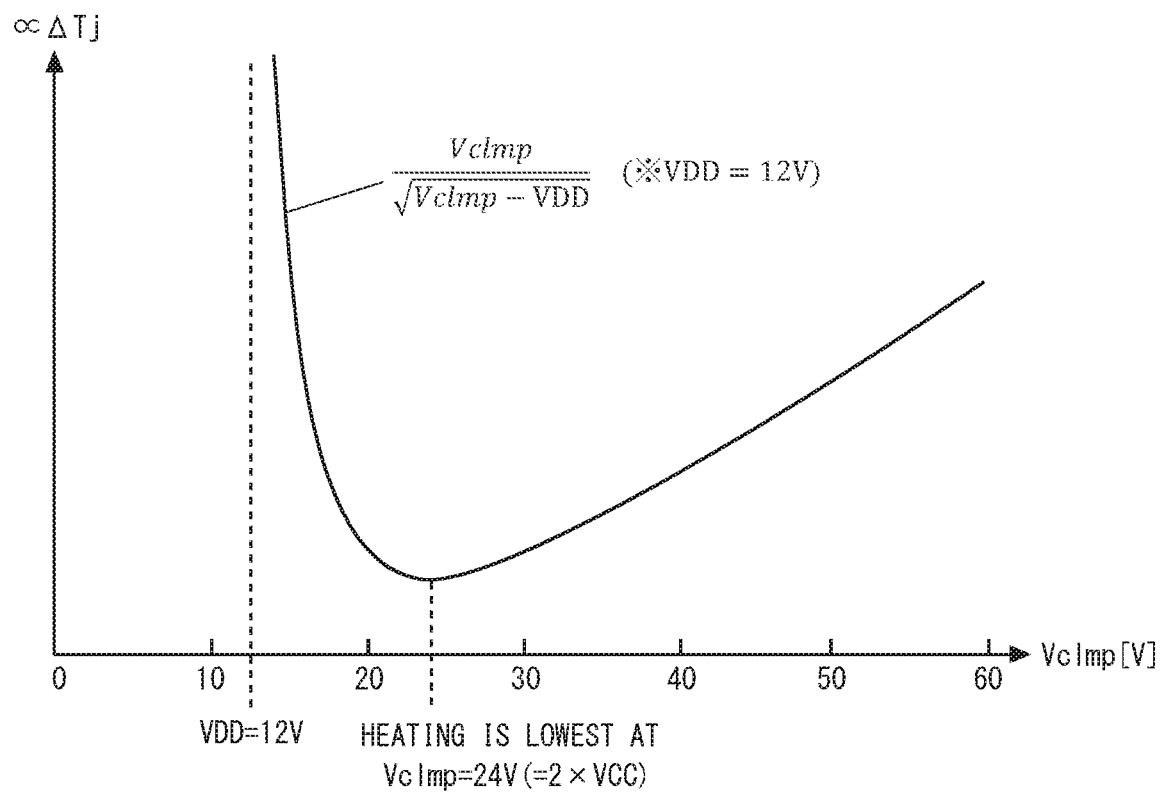
FIG. 3 is a graph illustrating a clamp voltage that is set in the semiconductor device according to the first embodiment.

FIG. 3 is a graph showing the relationship between the clamp voltage Vclmp and the temperature rise ΔT obtained based on the above equation (5). FIG. 3 shows that the clamp voltage Vclmp at which the temperature rise ΔT is the smallest exists in the semiconductor device 1. Thus, the temperature rise ΔT is differentiated with respect to the clamp voltage Vclmp to be constantly zero, and it is organized with respect to the clamp voltage Vclmp, and the clamp voltage Vclmp at which heating is the lowest is obtained by the following equation (6).

[equation 6]

$$\frac{\partial \Delta T}{\partial Vclmp} = 0 \rightarrow Vclmp = 2VDD \quad (6)$$

The above equation (6) shows that the clamp voltage Vclmp at which heating is the lowest is twice the power supply voltage VDD. Thus, in the semiconductor device 1 according to the first embodiment, the ratio of the resistance of the reference current setting resistor Rref and the resistance of the comparative current setting resistor Rdet is set to 1:2. Consequently, the value of the reference current Iref when the output voltage Vout is equal to the power supply voltage VDD is twice the comparative current Icomp.

Figure 4:
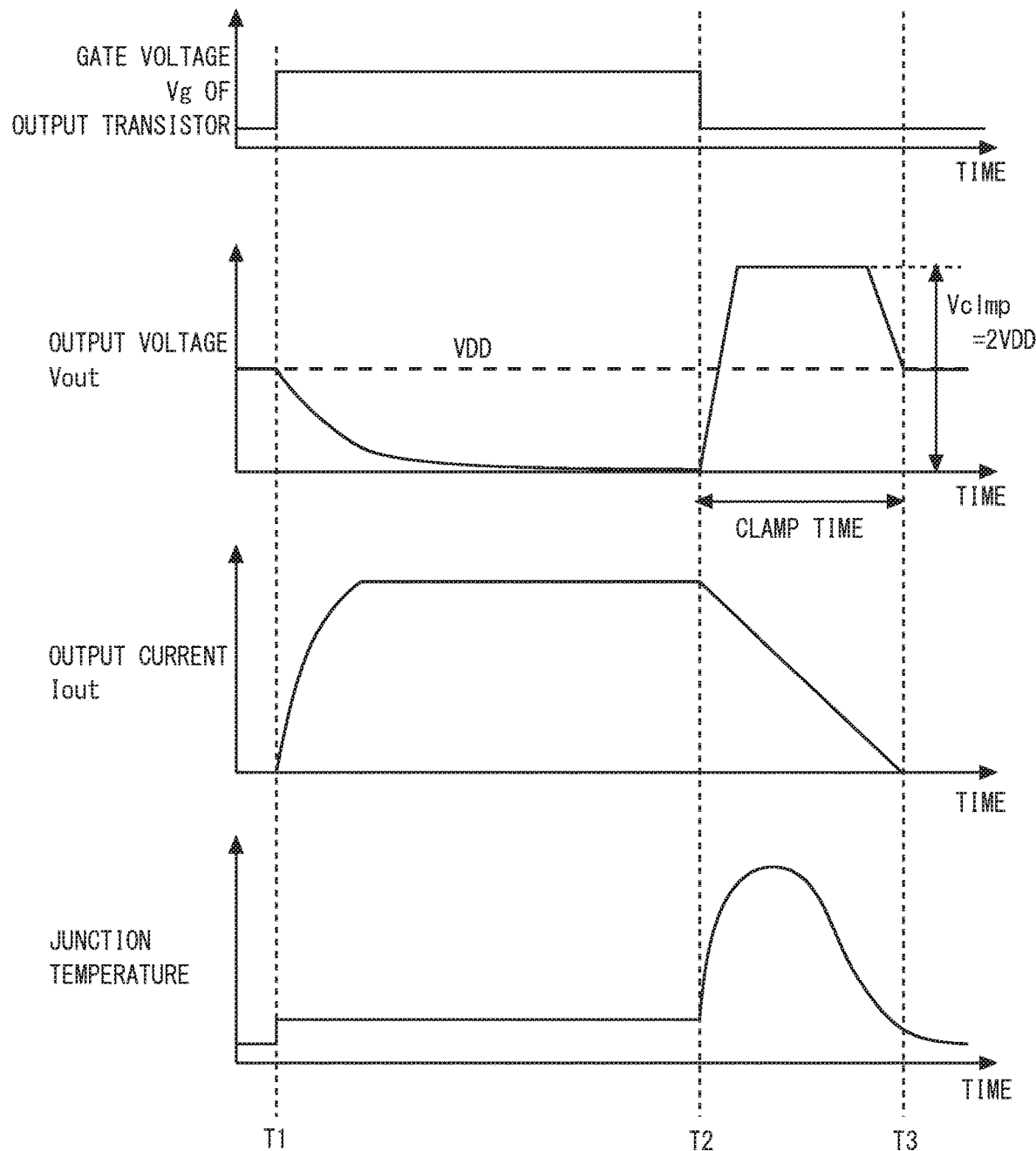
FIG. 4 is a timing chart illustrating the operation of the semiconductor device according to the first embodiment.

The operation of the semiconductor device 1 according to the first embodiment is described hereinafter. FIG. 4 shows a timing chart illustrating the operation of the semiconductor device according to the first embodiment. As shown in FIG. 4, at the timing T1 when the gate voltage Vg of the output transistor 13 rises, the semiconductor device 1 turns on the output transistor 13. The output voltage Vout thereby decreases.

Next, at the timing T2 when the gate voltage Vg of the output transistor 13 falls, the semiconductor device 1 turns off the output transistor 13. The ground voltage that has been supplied to the load circuit RL is thereby cut off, and the output voltage Vout increases due to the inductive load of the load circuit RL. At this time, in the semiconductor device 1, the output voltage Vout is clamped to the clamp voltage Vclmp by the overvoltage protection circuit 12. During the clamp time when the output voltage Vout is clamped by the overvoltage protection circuit 12, the output current Iout that flows through the output transistor 13 decreases gradually.

Further, the junction temperature of the semiconductor chip during the clamp time becomes higher than that in the period when the output transistor 13 is on. This is because, after the timing T2, the output transistor 13 becomes the state with a higher impedance than before the timing T2. In the semiconductor device 1, during the clamp time, the output transistor 13 is in the state of feedback control by the overvoltage protection circuit 12, and the on-state of the output transistor 13 is controlled so that the output voltage Vout does not exceed the clamp voltage Vclmp.

Then, at the timing T3 when the clamp time has elapsed from the timing T2, the output voltage Vout becomes the power supply voltage VDD.

Figure 5:
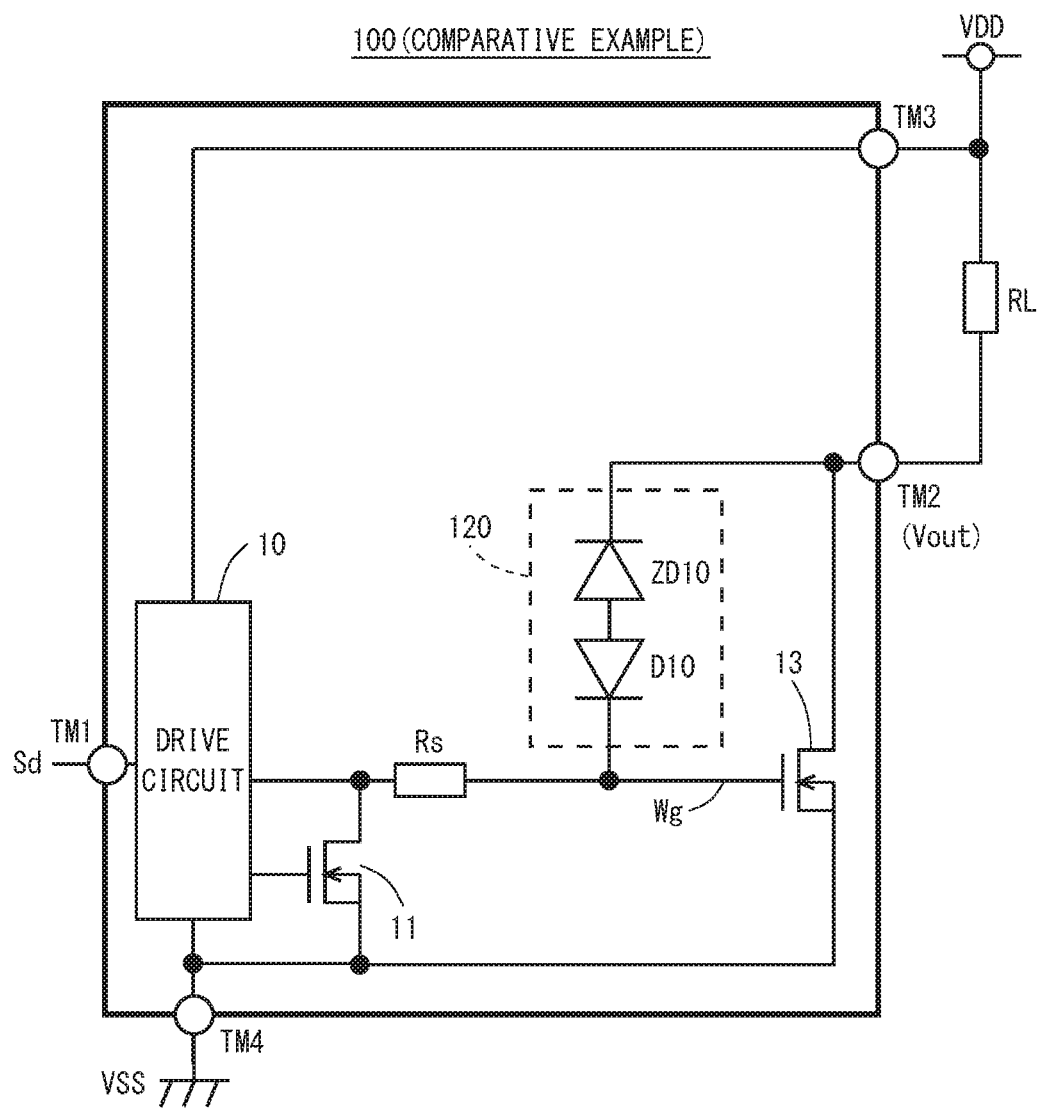
FIG. 5 is a block diagram of a semiconductor device according to a comparative example.

The operation of a semiconductor device 100 according to a comparative example is described hereinafter in order to describe the clamp operation of the semiconductor device 1 according to the first embodiment in more detail. FIG. 5 shows a block diagram of the semiconductor device according to the comparative example. As shown in FIG. 5, the semiconductor device 100 according to the comparative example includes, instead of the overvoltage protection circuit 12, a dynamic clamp circuit 120 using a Zener diode ZD10 and a backflow prevention diode D10 which is disclosed in Japanese Unexamined Patent Publication No. 2000-200902. Note that the semiconductor device 100 according to the comparative example shown in FIG. 5 is devised by the inventor on the basis of the circuit shown in FIG. 7 of Japanese Unexamined Patent Publication No. 2000-200902.

In the semiconductor device 100 according to the comparative example, the clamp voltage Vclmp is Vclmp=Vzd+Vdi+Vth(13) when a Zener voltage of the Zener diode ZD10 is Vzd, a forward voltage of the diode D10 is Vdi, and a threshold voltage of the output transistor 13 is Vth(13). Thus, in the semiconductor device 100 according to the comparative example, the clamp voltage Vclmp is set independently of the power supply voltage VDD, and it is constant regardless of the power supply voltage VDD.

If it is assumed that the forward voltage Vdi of the diode D10 and the threshold voltage Vth(13) of the output transistor 13 are sufficiently lower than the Zener voltage Vzd of the Zener diode ZD10, the clamp voltage Vclmp of the semiconductor device 100 can be regarded as the Zener voltage Vzd. Thus, the following description is based on the assumption that the clamp voltage Vclmp of the semiconductor device 100 is the Zener voltage Vzd. Note that the variation of the clamp voltage Vclmp, which is described later, includes the variation component of the threshold voltage Vth(13) of the output transistor 13, the variation component of the forward voltage Vdi of the diode D10, and the variation component of the Zener voltage Vzd of the Zener diode ZD10.

Figure 6:
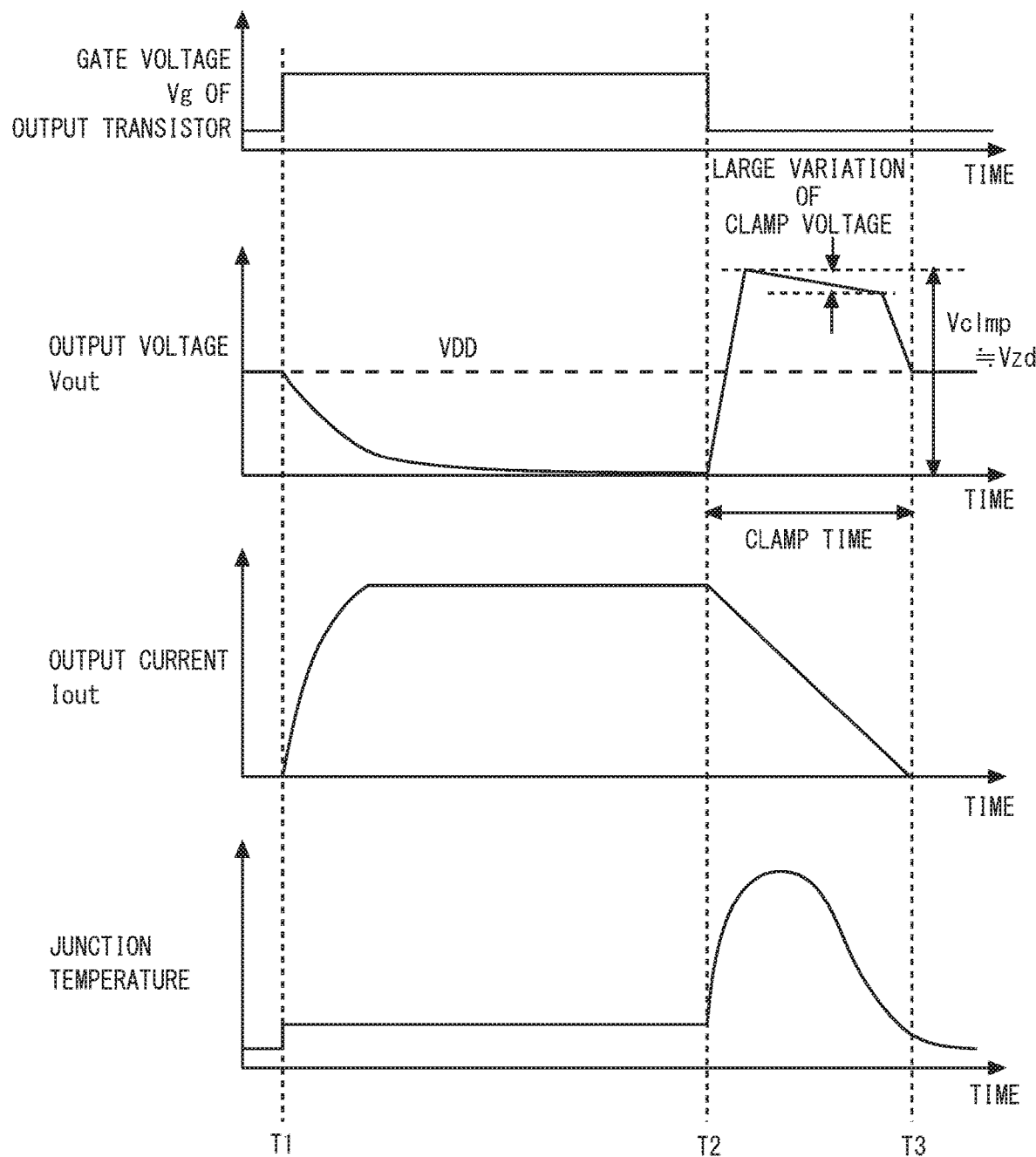
FIG. 6 is a timing chart illustrating the operation of the semiconductor device according to the comparative example.

FIG. 6 is a timing chart illustrating the operation of the semiconductor device 100 according to the comparative example. The timing chart shown in FIG. 6 is the one when the semiconductor device 100 performs the same operation as the operation of the semiconductor device 1 shown in FIG. 4.

As shown in FIG. 6, in the semiconductor device 100 according to the comparative example also, the output voltage Vout is clamped after the timing T2, and the output voltage Vout becomes the clamp voltage Vclmp. However, in the semiconductor device 100 according to the comparative example, the threshold voltage Vth(13) of the output transistor 13 decreases due to heating, and the clamp voltage Vclmp decreases during the clamp time. Note that, although this variation of the clamp voltage is mainly by the variation component of the threshold voltage Vth(13) of the output transistor 13, which is a heating element, the variation due to heating of the output transistor 13 occurs also in the forward voltage Vdi of the diode D10 and the Zener voltage Vzd of the Zener diode ZD10. In this manner, in the semiconductor device 100 according to the comparative example, the clamp voltage Vclmp varies, which causes an increase in the consumption energy during the clamp operation and elongation of the clamp time, resulting in a greater temperature rise ΔT.

Figure 7:
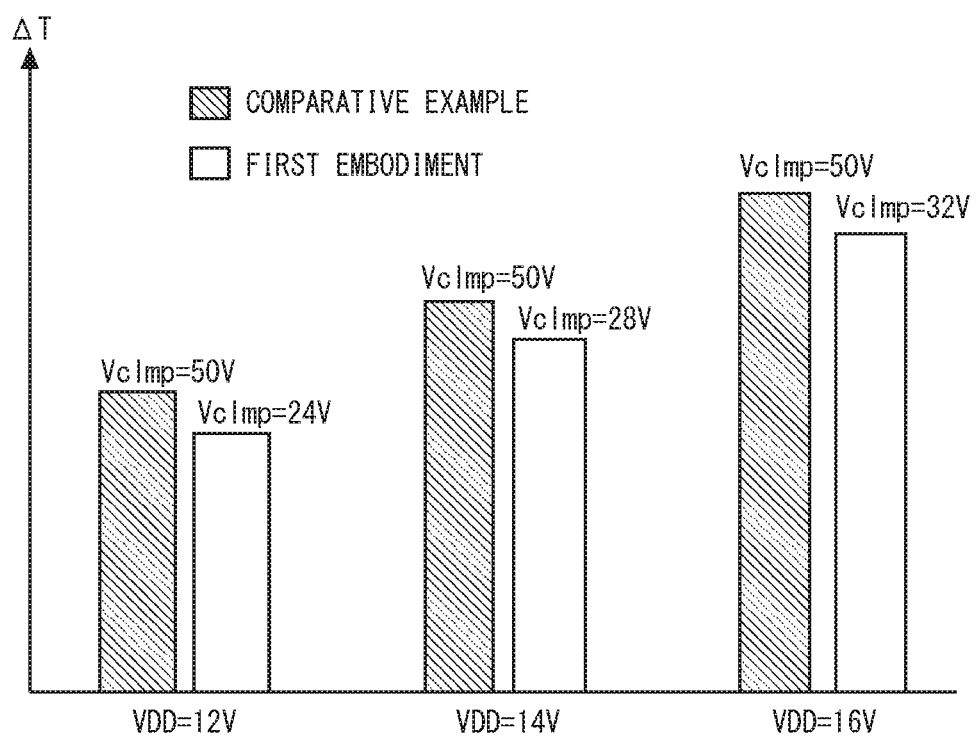
FIG. 7 is a graph to compare a difference in junction temperature during a clamp time between the semiconductor device according to the first embodiment and the semiconductor device according to the comparative example.

FIG. 7 is a graph to compare a difference in junction temperature during a clamp time between the semiconductor device according to the first embodiment and the semiconductor device according to the comparative example. In the example shown in FIG. 7, the power supply voltage VDD is 12V, 14V and 16V, the clamp voltage Vclmp of the semiconductor device 100 according to the comparative example is 50V, and the clamp voltage Vclmp of the semiconductor device 1 according to the first embodiment is set to twice the power supply voltage VDD. As shown in FIG. 7, the temperature rise ΔT of the semiconductor device 100 according to the comparative example is greater than that of the semiconductor device 1 according to the first embodiment regardless of the power supply voltage VDD.

As described above, in the semiconductor device 1, the clamp voltage Vclmp (e.g., Vclmp=2VDD) at which heating in the clamp operation is the lowest exists. In the semiconductor device 1 according to the first embodiment, the clamp voltage Vclmp that varies in proportion to the power supply voltage VDD can be set. Thus, in the semiconductor device 1 according to the first embodiment, heating of the semiconductor chip during the clamp operation can be the lowest at all times regardless of the power supply voltage VDD.

Further, in the semiconductor device 1 according to the first embodiment, because heating of the semiconductor chip is the lowest at any power supply voltage VDD, there is no need of redundancy for the area of a power MOS valid cell in the semiconductor chip where the output transistor 13 is formed. Thus, in the semiconductor device 1 according to the first embodiment, it is possible to optimize the area of the semiconductor chip for a heat value in the clamp operation and prevent an increase in the chip area.

Further, in the semiconductor device 1 according to the first embodiment, the clamp voltage Vclmp during the clamp operation can be maintained at a constant value. It is thereby possible to reduce the time of the clamp operation in the semiconductor device 1 according to the first embodiment.

Figure 8:
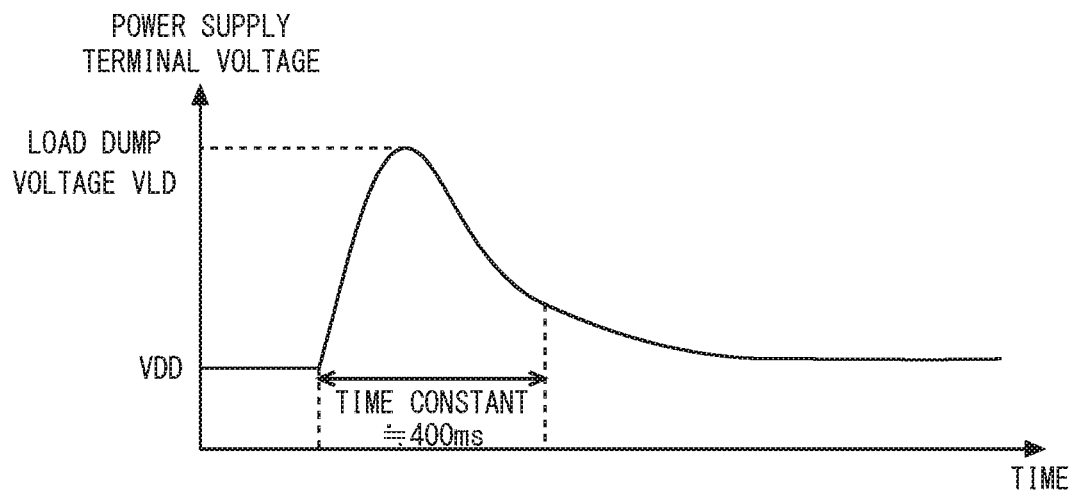
FIG. 8 is a graph illustrating a change in voltage of a power supply terminal in the event of a load dump.

Further, in the semiconductor device 1 according to the first embodiment, upon occurrence of power shutdown such as battery's coming off when receiving power supply from a power supply device such as a battery to a power supply terminal, a surge called a load dump where the power supply voltage VDD supplied to the power supply terminal temporarily rises occurs. The surge has a higher energy than a voltage rise that occurs when switching the output transistor 13 from on to off. FIG. 8 is a graph showing a voltage change in the power supply terminal in the event of a load dump. As shown in FIG. 8, when a load dump occurs, the voltage of the power supply terminal temporarily rises to a load dump voltage VLD, which is higher than the power supply voltage VDD.

In the semiconductor device 100 according to the comparative example, an active clamp circuit 120 operates upon occurrence of a load dump, and the output transistor 13 turns on, and heating of the output transistor 13 increases, which can causes breakdown. However, in the semiconductor device 1 according to the first embodiment, because the clamp voltage Vclmp varies in proportion to the power supply voltage VDD, the overvoltage protection circuit 12 can be maintained to be non-operating for a load dump that involves an increase in the power supply voltage VDD. It is therefore possible to prevent breakdown of the output transistor 13 due to a load dump in the semiconductor device 1 according to the first embodiment.

Figure 9:
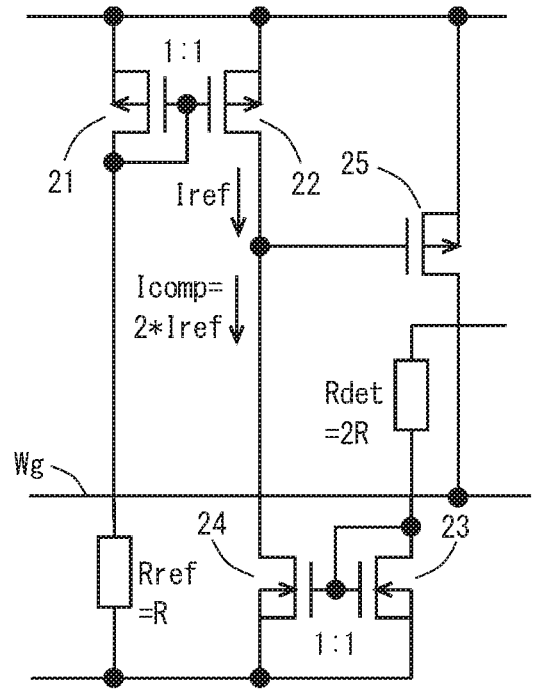
FIG. 9 is a circuit diagram illustrating modified examples of an overvoltage protection circuit in the semiconductor device according to the first embodiment.
Figure 9:
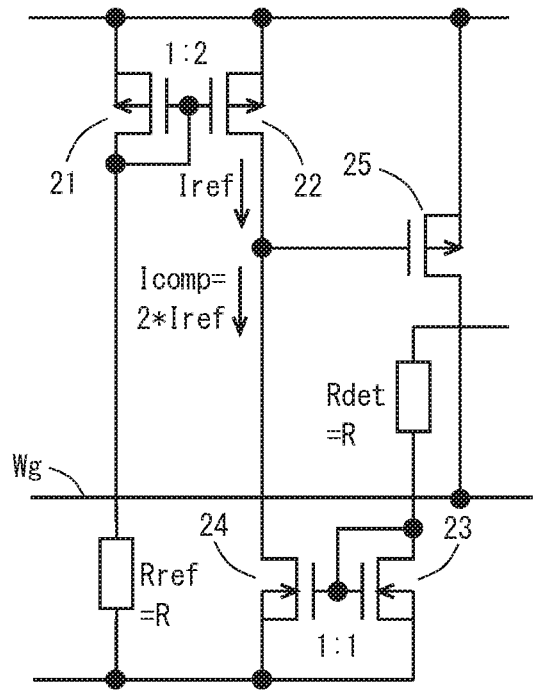
Figure 9:
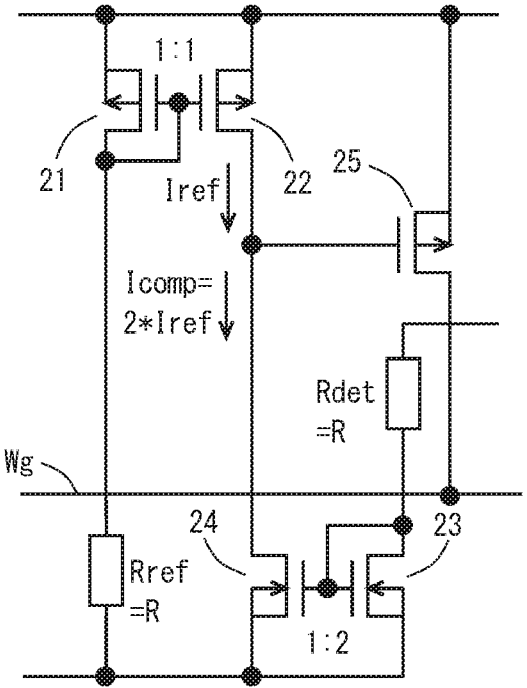

There are several methods of setting the values of the reference current Iref and the comparative current Icomp in the overvoltage protection circuit 12. FIG. 9 is a circuit diagram illustrating modified examples of the overvoltage protection circuit in the semiconductor device according to the first embodiment where parameters of circuit elements that constitute the overvoltage protection circuit 12 are set by different methods.

In the basic form of the first embodiment shown in FIG. 9, a resistance value of the reference current setting resistor Rref is R, and a resistance value of the comparative current setting resistor Rdet is set to 2R, which is twice the reference current setting resistor Rref. In the first modified example, the transistor size ratio of the PMOS transistor 21 and the PMOS transistor 22 is 1:2. In the second modified example, the transistor size ratio of the NMOS transistor 23 and the NMOS transistor 24 is 2:1. The size of a transistor is determined by W/L where a gate length is L and a gate width is W. In any setting methods of FIG. 9, the ratio of the reference current Iref and the comparative current Icomp when the output voltage Vout becomes the power supply voltage VDD can be set to 2:1.

Second Embodiment

Figure 10:
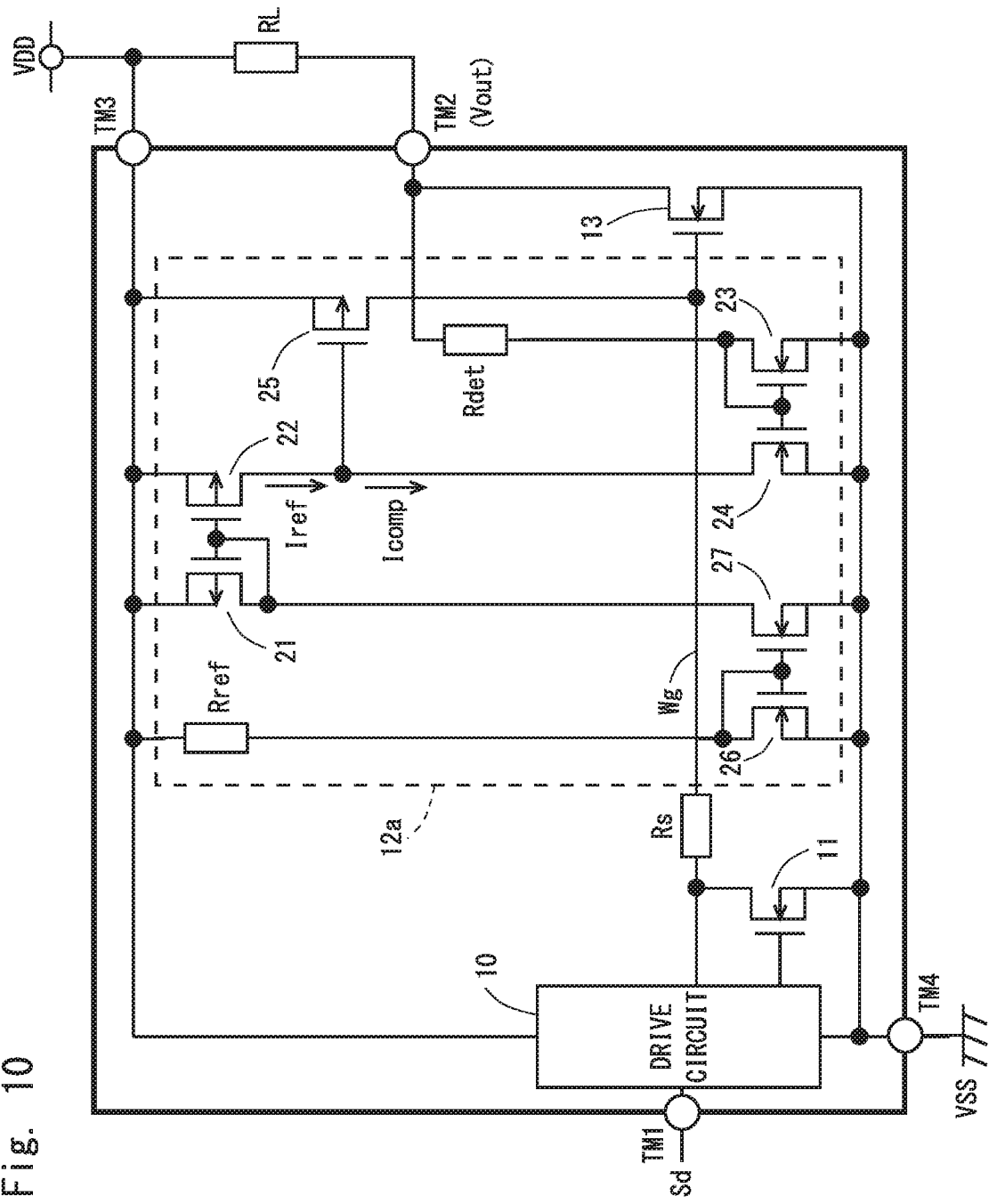
FIG. 10 is a block diagram of a semiconductor device according to a second embodiment.

In a second embodiment, a semiconductor device 2 that includes an overvoltage protection circuit 12a, which is a modified example of the overvoltage protection circuit 12 of the first embodiment, is described hereinafter. FIG. 10 is a block diagram of the semiconductor device 2 according to the second embodiment. Note that, in the description of the second embodiment, the same elements as those described in the first embodiment are denoted by the same reference numerals as in the first embodiment and not redundantly described.

As shown in FIG. 10, in the overvoltage protection circuit 12a also, a first current source, a second current source and an overvoltage protection transistor 25 are included. Further, in the overvoltage protection circuit 12a also, a PMOS transistor is used as the overvoltage protection transistor 25. Further, the first current source generates a reference current Iref which is proportional to the power supply voltage VDD. The second current source generates a comparative current Icomp based on a voltage difference (e.g., output voltage Vout) between the ground terminal TM4 and the output terminal TM2. The overvoltage protection transistor 25 supplies, to the gate wire Wg, an overvoltage protection current which is dependent on a current difference between the reference current Iref and the comparative current Icomp. The reference current Iref is set to be approximately twice the comparative current Icomp in the state where the output voltage Vout is equal to the power supply voltage VDD.

The first current source includes a first transistor (e.g., NMOS transistor 26), a second transistor (e.g., NMOS transistor 27), a third transistor (e.g., PMOS transistor 21), a fourth transistor (e.g., PMOS transistor 22), and a reference current setting resistor Rref. One end of the reference current setting resistor Rref is connected to the power supply terminal TM3. The drain of the NMOS transistor 26 is connected to the other end of the reference current setting resistor Rref, the source is connected to the ground terminal TM4, and the gate and the drain are connected to each other. The source of the NMOS transistor 27 is connected to the ground terminal TM4, and the gate is connected in common to the gate of the NMOS transistor 26. The drain of the PMOS transistor 21 is connected to the drain of the NMOS transistor 27, the source is connected to the power supply terminal TM3, and the gate and the drain are connected to each other. The source of the PMOS transistor 22 is connected to the power supply terminal TM3, the drain is connected to the gate of the overvoltage protection transistor 25, and the gate is connected in common to the gate of the PMOS transistor 21.

The NMOS transistor 26 and the NMOS transistor 27 form a current mirror circuit. A current obtained by dividing a result of subtracting a threshold voltage Vth(N) of the NMOS transistor 26 from the power supply voltage VDD by a reference current setting resistance Rref flows into the NMOS transistor 26, and the NMOS transistor 27 mirrors a current that flows through the NMOS transistor 26. Further, a current that is output from the NMOS transistor 27 is mirrored by the current mirror circuit that is composed of the PMOS transistors 21 and 22 and output as the reference current Iref. Thus, the reference current Iref has a value of (VDD−Vth(N))/Rref.

The second current source includes a fifth transistor (e.g., NMOS transistor 23), a sixth transistor (e.g., NMOS transistor 24), and a comparative current setting resistor Rdet. One end of the comparative current setting resistor Rdet is connected to the output terminal TM2. The drain of the NMOS transistor 23 is connected to the other end of the comparative current setting resistor Rdet, the source is connected to the ground terminal TM4, and the gate and the drain are connected to each other. The source of the NMOS transistor 24 is connected to the ground terminal TM4, the drain is connected to the gate of the overvoltage protection transistor 25, and the gate is connected in common to the gate of the NMOS transistor 23.

The NMOS transistor 23 and the NMOS transistor 24 form a current mirror circuit. A current obtained by dividing a result of subtracting a threshold voltage Vth(N) of the NMOS transistor 23 from the output voltage Vout by a comparative current setting resistance Rdet flows into the NMOS transistor 23, and the NMOS transistor 24 mirrors a current that flows through the NMOS transistor 23 and outputs it as the comparative current Icomp. Thus, the comparative current Icomp has a value of (Vout−Vth(N))/Rdet.

In the semiconductor device 2 according to the second embodiment, both of the reference current Iref and the comparative current Icomp are determined based on the threshold voltage Vth(N) of the NMOS transistor. In the semiconductor device, fluctuations of the PMOS transistor and the NMOS transistor occur independently of one another. Therefore, by determining the reference current Iref and the comparative current Icomp by the transistors of the same polarity as in the overvoltage protection circuit 12*a*, it is possible to eliminate a deviation of a current value which is caused by manufacturing fluctuations of transistors. Thus, the semiconductor device 2 according to the second embodiment can set the clamp voltage Vclmp more accurately than the semiconductor device 1 according to the first embodiment. Further, the semiconductor device 2 according to the second embodiment can suppress heating of the semiconductor chip than the semiconductor device 1 according to the first embodiment.

Third Embodiment

Figure 11:
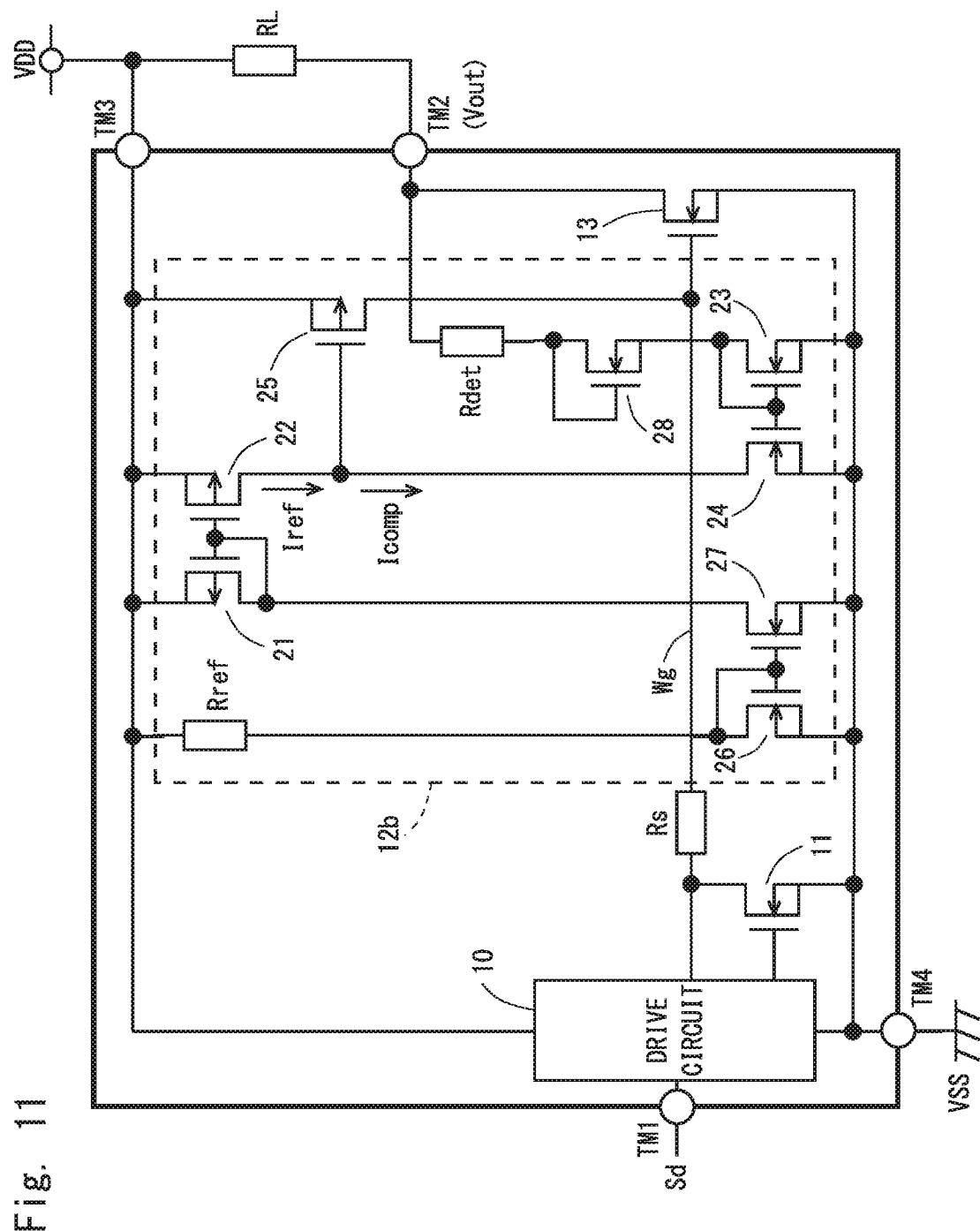
FIG. 11 is a block diagram of a semiconductor device according to a third embodiment.

In a third embodiment, a semiconductor device 3 that includes an overvoltage protection circuit 12*b*, which is a modified example of the overvoltage protection circuit 12*a* of the second embodiment, is described hereinafter. FIG. 11 is a block diagram of the semiconductor device 3 according to the third embodiment. Note that, in the description of the third embodiment, the same elements as those described in the first and second embodiments are denoted by the same reference numerals as in the first embodiment and not redundantly described.

As shown in FIG. 11, the overvoltage protection circuit 12*b* has a structure in which an NMOS transistor 28 is added to the overvoltage protection circuit 12*a*. The NMOS transistor 28 is in diode connection where the gate and the drain are connected. Thus, the NMOS transistor 28 functions as a diode where the anode is connected to the comparative current setting resistor Rdet, and the cathode is connected to the drain of the NMOS transistor 23.

In the semiconductor device 3 according to the third embodiment, when the clamp voltage Vclmp is set to twice the power supply voltage VDD, and the comparative current setting resistance Rdet is set to twice the reference current setting resistance Rref, the comparative current Icomp when the output voltage Vout reaches the clamp voltage Vclmp is calculated by the following equation (7).

$$Icomp=2VDD-2Vth/2Rref=VDD-Vth/Rref \tag{7}$$

Further, in the semiconductor device 3 according to the third embodiment, the reference current Iref is calculated by the following equation (8).

$$Iref=VDD-Vth/Rref \tag{8}$$

In the equations (7) and (8), Vth is a threshold voltage of the NMOS transistor.

As described above, in the semiconductor device 3 according to the third embodiment, the reference current Iref and the comparative current Icomp when the output voltage Vout reaches the clamp voltage Vclmp which corresponds to twice the power supply voltage VDD can be accurately set to the same current value. The semiconductor device 3 according to the third embodiment can thereby set the clamp voltage Vclmp to twice the power supply voltage VDD more accurately than the semiconductor devices according to the first and second embodiments. Further, the semiconductor device 3 according to the third embodiment can suppress heating of the semiconductor chip more effectively than the semiconductor devices according to the first and second embodiments.

Note that, in the overvoltage protection circuit 12 of the semiconductor device 1 according to the first embodiment also, a transistor corresponding to the NMOS transistor 28 can be placed. In this case, the transistor corresponding to the NMOS transistor 28 is placed between the comparative current setting resistor Rdet and the drain of the NMOS transistor 23. It is thereby possible to improve the setting accuracy of the clamp voltage Vclmp also in the semiconductor device 1 according to the first embodiment.

Fourth Embodiment

Figure 12:
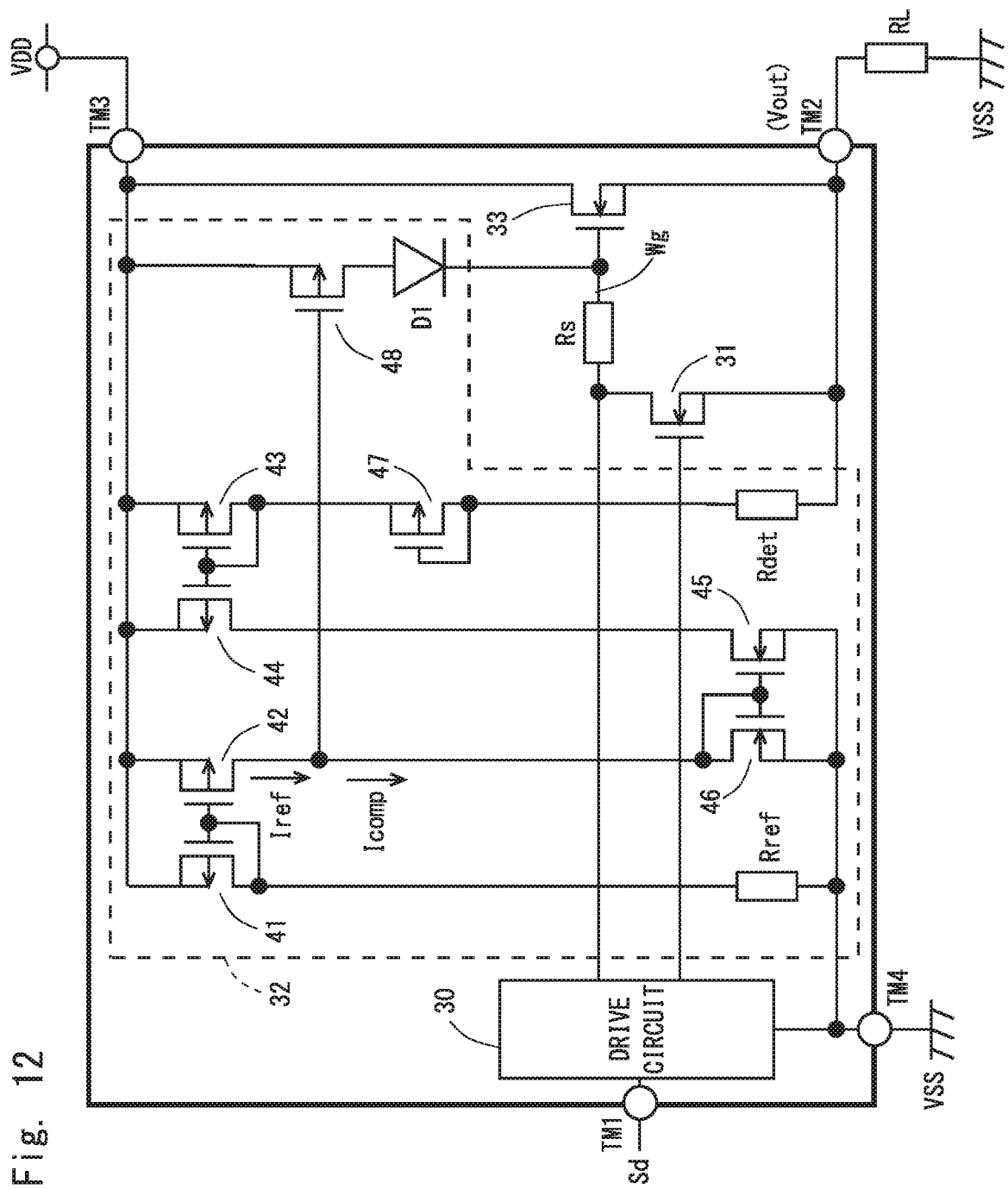
FIG. 12 is a block diagram of a semiconductor device according to a fourth embodiment.

In a fourth embodiment, an example in which an overvoltage protection circuit 32, which corresponds to the overvoltage protection circuit 12, is applied to a high-side switch is described. FIG. 12 shows a block diagram of a semiconductor device 4 according to the fourth embodiment.

As shown in FIG. 12, the semiconductor device 4 according to the fourth embodiment is a high-side switch that switches whether or not to supply the power supply voltage VDD to the load circuit RL. Further, the load circuit RL to be controlled by the semiconductor device 4 according to the fourth embodiment includes an inductive load, a back electromotive force is generated when switching from the state of supplying the power supply voltage to the state of cutting off the power supply voltage, and the output voltage Vout becomes lower than the ground voltage due to the back electromotive force.

As shown in FIG. 12, the semiconductor device 4 according to the fourth embodiment includes a drive circuit 30, a discharge circuit 31, a current limiting resistor Rs, an overvoltage protection circuit 32, and an output transistor 33. The semiconductor device 4 according to the fourth embodiment is an example where the output transistor 33 is formed on the same semiconductor substrate as the drive circuit 30, the discharge circuit 31 and the overvoltage protection circuit 32. Further, the semiconductor device 4 according to the fourth embodiment has an input terminal TM1, an output terminal TM2, a first power supply terminal (e.g., ground terminal TM4), and a second power supply terminal (e.g., power supply terminal TM3). In the semiconductor device 4 according to the fourth embodiment, the output terminal TM2 is used also as an output voltage detection terminal for the overvoltage protection circuit 32 to detect an output voltage.

The drive circuit 30 outputs a drive signal for controlling the output transistor. The drive signal is generated based on a drive control signal Sd that is output from an arithmetic circuit such as MCU (Micro Controller Unit), which is not shown. In the example shown in FIG. 12, the drive control signal Sd is input to the drive circuit 30 through the input terminal TM1. The drive signal is high level when the drive control signal Sd is high level, and it is low level when the drive control signal Sd is low level. In the example of FIG. 12, the drive circuit 30 supplies the drive signal to the output transistor 33 through the current limiting resistor Rs that is placed on a gate wire Wg. Note that, in the fourth embodiment, the drive signal that is supplied to the output transistor 33 has a higher voltage than the power supply voltage VDD when it becomes a high level.

The discharge circuit 31 is connected between the gate wire Wg and the source of the output transistor 33. To be specific, the discharge circuit 31 has an NMOS transistor whose drain is connected to a part of the gate wire Wg which is between the current limiting resistor Rs and the drive circuit 30, source is connected to the output terminal TM2, and gate is supplied with a control signal that is output from the drive circuit 30. Then, the discharge circuit 31 is controlled to be conductive when the drive circuit 30 turns off the output transistor 33.

The output transistor 33 is connected between the other end of the load circuit RL and the power supply terminal TM3. In the example shown in FIG. 12, because the output transistor 33 is included in the semiconductor device 4, the load circuit RL is connected to the output transistor 33 through the output terminal TM2. The gate wire Wg is connected to the gate of the output transistor 33. In the semiconductor device 4 according to the fourth embodiment, an NMOS transistor whose source is connected to the output terminal TM2 and drain is connected to the power supply terminal TM3 is used as the output transistor 33.

The overvoltage protection circuit 32 controls the output transistor 33 based on a voltage difference between the power supply terminal TM3 and the output terminal TM2. To be specific, in the state when the output transistor 33 is controlled to be cut off, the overvoltage protection circuit 32 controls the output transistor 33 to be conductive when a voltage difference between the power supply terminal TM3 and the output terminal TM2 reaches a clamp voltage Vclmp that is set to be proportional to a voltage difference (e.g., power supply voltage VDD) between a first power supply (e.g., power supply voltage VDD) and a second power supply (e.g., ground voltage VSS). The clamp voltage Vclmp is set to a voltage when a voltage difference between the power supply terminal TM3 and the output terminal TM2 becomes approximately twice the power supply voltage VDD. In the semiconductor device 4 according to the fourth embodiment, the clamp voltage Vclmp is set to a voltage (−VDD), where the output voltage Vout is shifted to the negative side by the amount of the power supply voltage VDD.

The overvoltage protection circuit 32 includes a first current source, a second current source, an overvoltage protection transistor 48, and a backflow prevention diode D1.

In the semiconductor device 4 according to the fourth embodiment, a PMOS transistor is used as the overvoltage protection transistor 48. Further, in the fourth embodiment, the backflow prevention diode D1 whose anode is connected to the drain of the overvoltage protection transistor 48 and cathode is connected to the gate wire Wg is placed. In the fourth embodiment, a current that flows from the gate wire Wg to the power supply terminal VDD needs to be prevented by the backflow prevention diode D1 when a high-level voltage that is supplied to the output transistor 33 is higher than the power supply voltage VDD and a high-level drive signal is supplied to the output transistor 33 by the backflow prevention diode D1.

The first current source generates a reference current Iref which is proportional to the power supply voltage VDD. The second current source generates a comparative current Icomp based on a voltage difference (e.g., output voltage Vout) between the power supply terminal TM3 and the output terminal TM2. The overvoltage protection transistor 48 supplies, to the gate wire Wg, an overvoltage protection current which is dependent on a current difference between the reference current Iref and the comparative current Icomp. The reference current Iref is set to be approximately twice the comparative current Icomp in the state where the output voltage Vout is equal to the ground voltage VSS.

The first current source includes a first transistor (e.g., PMOS transistor 41), a second transistor (e.g., PMOS transistor 42), and a reference current setting resistor Rref. One end of the reference current setting resistor Rref is connected to the ground terminal TM4. The drain of the PMOS transistor 41 is connected to the other end of the reference current setting resistor Rref, the source is connected to the power supply terminal TM3, and the gate and the drain are connected to each other. The source of the PMOS transistor 42 is connected to the power supply terminal TM3, the drain is connected to the gate of the overvoltage protection transistor 48, and the gate is connected in common to the gate of the PMOS transistor 41.

The PMOS transistor 41 and the PMOS transistor 42 form a current mirror circuit. A current obtained by dividing a result of subtracting a threshold voltage Vth of the PMOS transistor 41 from the power supply voltage VDD by a reference current setting resistance Rref flows into the PMOS transistor 41, and the PMOS transistor 42 mirrors a current that flows through the PMOS transistor 41 and outputs it as the reference current Iref. Thus, the reference current Iref has a value of (VDD−Vth)/Rref.

The second current source includes a third transistor (e.g., PMOS transistor 43), a fourth transistor (e.g., PMOS transistor 44), a fifth transistor (e.g., NMOS transistor 45), a sixth transistor (e.g., NMOS transistor 46), a PNOS transistor 47, and a comparative current setting resistor Rdet.

One end of the comparative current setting resistor Rdet is connected to the output terminal TM2. The drain of the PMOS transistor 43 is connected to the other end of the comparative current setting resistor Rdet, the source is connected to the power supply terminal TM3, and the gate and the drain are connected to each other. Note that, in the fourth embodiment, the drain of the PMOS transistor 43 is connected to the other end of the comparative current setting resistor Rdet through the PMOS transistor 47. The source of the PMOS transistor 44 is connected to the power supply terminal TM3, the gate is connected in common to the gate of the PMOS transistor 43. The source of the NMOS transistor 45 is connected to the ground terminal TM4, the drain is connected to the drain of the PMOS transistor 44, and the gate and the drain are connected to each other. The source of the NMOS transistor 46 is connected to the ground terminal TM4, the gate is connected in common to the gate of the NMOS transistor 45, and the drain is connected to the gate of the overvoltage protection transistor 48. The gate and the drain of the PMOS transistor 47 are connected, the drain is connected to the other end of the comparative current setting resistor Rdet, and the source is connected to the drain of the PMOS transistor 43. Thus, the PMOS transistor 47 functions as a diode where the anode is connected to the comparative current setting resistor Rdet, and the cathode is connected to the drain of the PMOS transistor 43.

The PMOS transistor 43 and the PMOS transistor 44 form a current mirror circuit. A current obtained by dividing a result of subtracting a threshold voltage Vth of the PMOS transistor 43, 47 from a difference between the output voltage Vout and the power supply voltage VDD by a comparative current setting resistance Rdet flows into the PMOS transistor 43, and the PMOS transistor 44 mirrors a current that flows through the PMOS transistor 43 and outputs it as the comparative current Icomp. Thus, the comparative current Icomp has a value of (Vout−Vth)/Rdet. Note that, in the fourth embodiment, the comparative current Icomp that is output from the PMOS transistor 44 is looped back by the current mirror circuit that is composed of the NMOS transistors 45 and 46 and thereby supplied to the overvoltage protection transistor 48.

Figure 13:
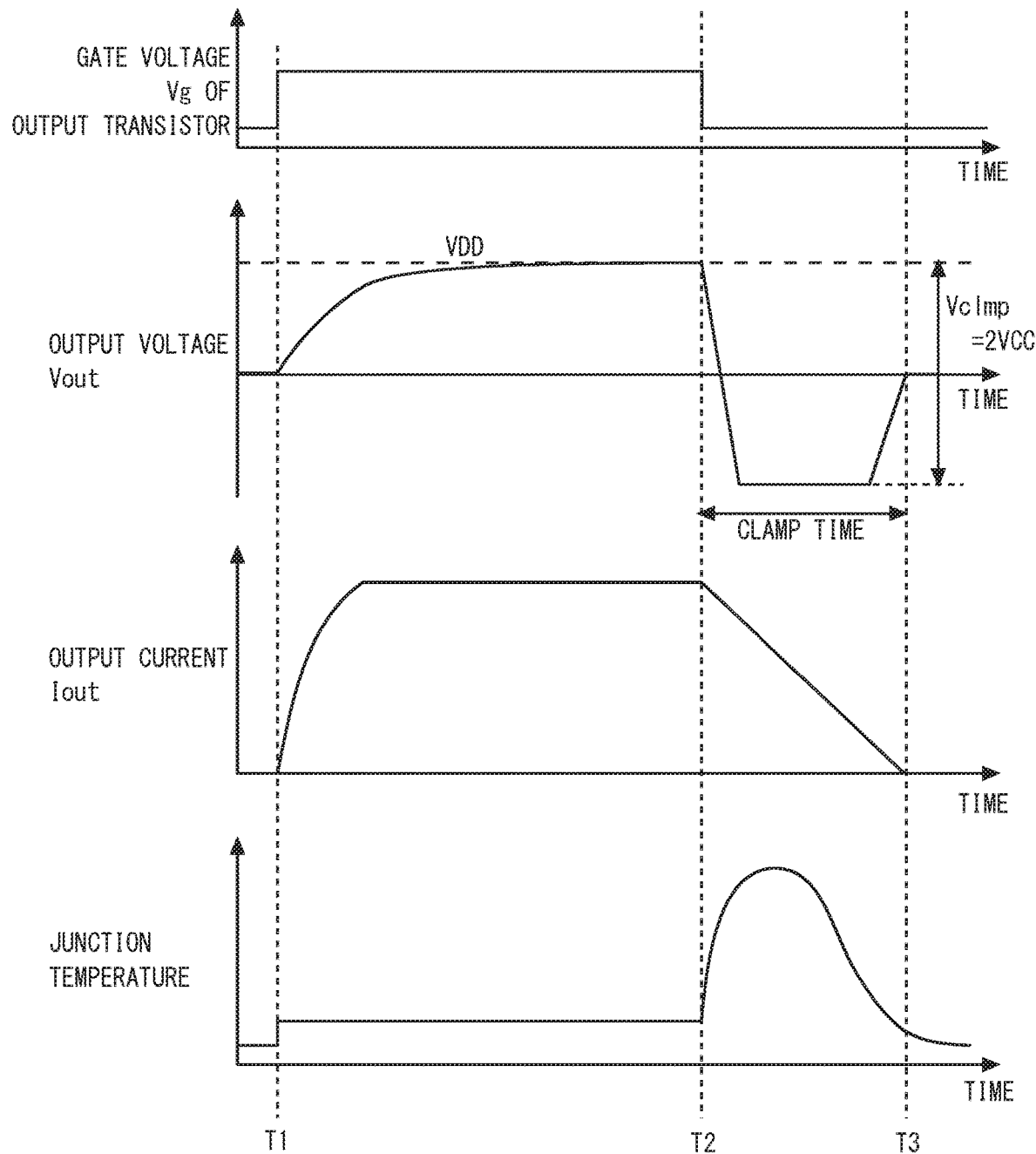
FIG. 13 is a timing chart illustrating the operation of the semiconductor device according to the fourth embodiment.

The operation of the semiconductor device 4 according to the fourth embodiment is described hereinafter. FIG. 13 is a timing chart illustrating the operation of the semiconductor device 4 according to the fourth embodiment. As shown in FIG. 13, at timing T1 when the gate voltage Vg of the output transistor 33 rises, the semiconductor device 4 turns on the output transistor 33. The output voltage Vout thereby increases.

Next, at the timing T2 when the gate voltage Vg of the output transistor 33 falls, the semiconductor device 4 turns off the output transistor 33. The power supply voltage that has been supplied to the load circuit RL is thereby cut off, and the output voltage Vout decreases due to the inductive load of the load circuit RL. At this time, in the semiconductor device 4, the output voltage Vout is clamped to the clamp voltage Vclmp by the overvoltage protection circuit 32. During the clamp time when the output voltage Vout is clamped by the overvoltage protection circuit 32, the output current Iout that flows through the output transistor 33 decreases gradually.

Further, the junction temperature of the semiconductor chip during the clamp time becomes higher than that in the period when the output transistor 33 is on. This is because, after the timing T2, the output transistor 33 becomes the state with a higher impedance than before the timing T2. In the semiconductor device 4, during the clamp time, the output transistor 33 is in the state of feedback control by the overvoltage protection circuit 32, and the on-state of the output transistor 33 is controlled so that the output voltage Vout does not exceed the clamp voltage Vclmp.

Then, at the timing T3 when the clamp time has elapsed from the timing T2, the output voltage Vout becomes the ground voltage VSS.

As described above, in the high-side switch also, fluctuations of the clamp voltage Vclmp during the clamp operation can be suppressed by using the overvoltage protection circuit 32 that has the function corresponding to the overvoltage protection circuit 12. Further, by using the overvoltage protection circuit 32, the clamp voltage Vclmp can vary in proportion to the power supply voltage VDD in the semiconductor device 4 according to the fourth embodiment as well.

Fifth Embodiment

Figure 14:
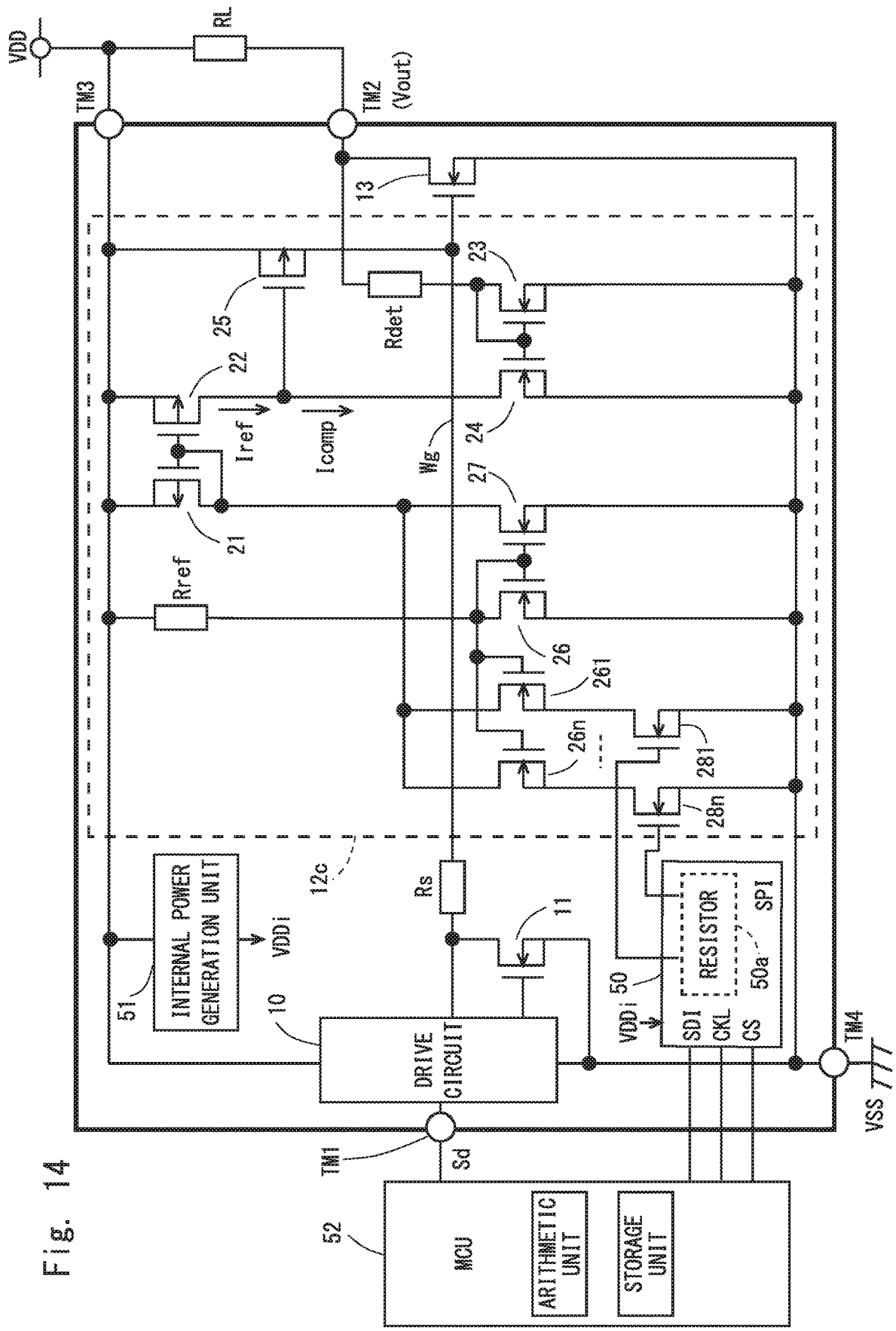
FIG. 14 is a block diagram of a semiconductor device according to a fifth embodiment.

In a fifth embodiment, a semiconductor device 5 that includes an overvoltage protection circuit 12c, which is a modified example of the overvoltage protection circuit 12a of the second embodiment, is described hereinafter. FIG. 14 is a block diagram of the semiconductor device 5 according to the fifth embodiment. Note that, in the description of the fifth embodiment, the same elements as those described in the first and second embodiments are denoted by the same reference numerals as in the first and second embodiments and not redundantly described.

The overvoltage protection circuit 12c is the one where a function to make fine adjustments of the reference current Iref based on a current adjustment value is added to the first current source of the overvoltage protection circuit 12a. As shown in FIG. 14, the overvoltage protection circuit 12c has a structure in which NMOS transistors 261 to 26n (n is an integer indicating the number of transistors; the same applies below) and NMOS transistors 281 to 28n are added to the overvoltage protection circuit 12.

The gates of the NMOS transistors 261 to 26n are connected in common to the gate of the NMOS transistors 26, and the drains of the same are connected to the drain of the NMOS transistors 26. The NMOS transistors 281 to 28n are connected between the sources of the NMOS transistors 261 to 26n and the ground terminal TM4. Further, the gates of the NMOS transistors 281 to 28n are supplied with fine adjustment values stored in a resistor 50a which correspond to the respective transistors.

In the semiconductor device 5 according to the fifth embodiment, a fine adjustment value is supplied to the overvoltage protection circuit 12c from an arithmetic unit (e.g., MCU (Micro Controller Unit) 52) that is placed externally. Further, in the semiconductor device 5 according to the fifth embodiment, a serial-parallel interface circuit 50 is placed in order to store a fine adjustment value. A resistor 50A is placed in the serial-parallel interface circuit 50, and a fine adjustment value is stored in the resistor 50a. Note that, in the example shown in FIG. 14, an internal power generation circuit 51 that generates an operating power VDDi of the serial-parallel interface circuit 50 from the power supply voltage VDD is placed in the semiconductor device 5.

In the semiconductor device 5 according to the fifth embodiment, 3-wire serial data communication is used as a way to supply a fine adjustment value from the MCU 52 to the semiconductor device 5. The 3-wire serial data communication is to communicate a data signal SDI that is synchronous with a clock with use of a data signal SDI, a clock signal CLK and a chip select signal CS. Then, the serial-parallel interface circuit 50 converts data that is output as serial data from the MCU 52 into parallel data and stores the data into the resistor 50a.

Figure 15:
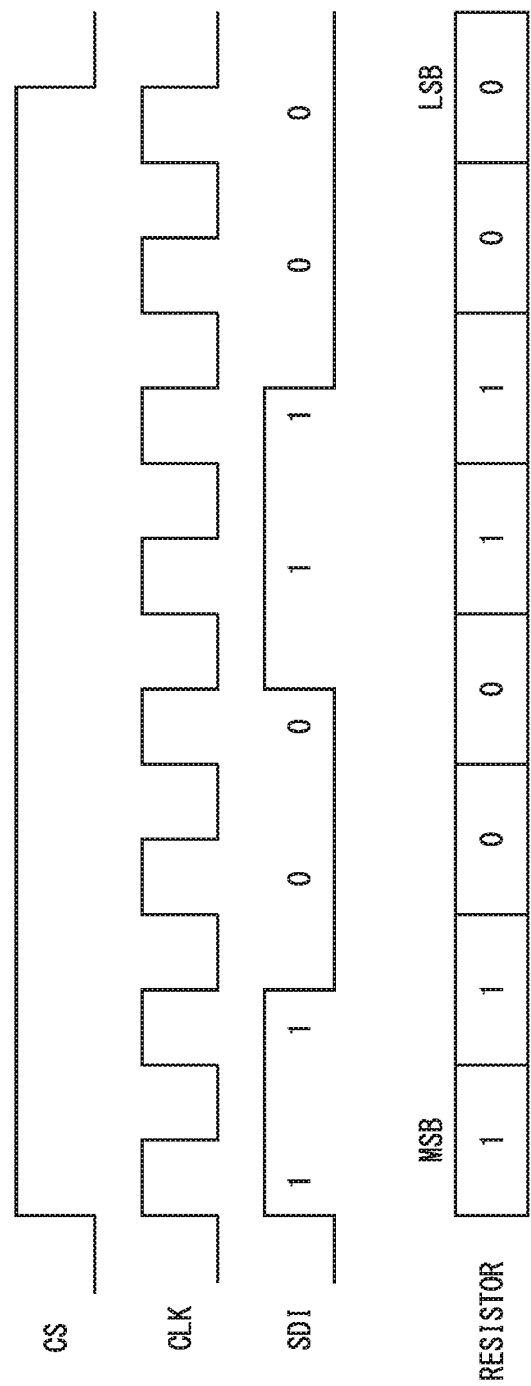
FIG. 15 is a timing chart illustrating a procedure to set a fine adjustment value to a resistor in the semiconductor device according to the fifth embodiment.

A method of setting a fine adjustment value by use of the 3-wire serial data communication is described hereinafter. FIG. 15 is a timing chart illustrating a procedure to set a fine adjustment value to the resistor in the semiconductor device according to the fifth embodiment.

As shown in FIG. 15, in the 3-wire serial data communication, the data signal SDI that is synchronous with the clock signal CLK is transmitted during the period when the chip select signal CS is high level. Then, the serial-parallel interface circuit 50 converts serial data into parallel data by using the clock signal CLK, and stores a fine adjustment value from MSB to LSB of the resistor.

Figure 16:
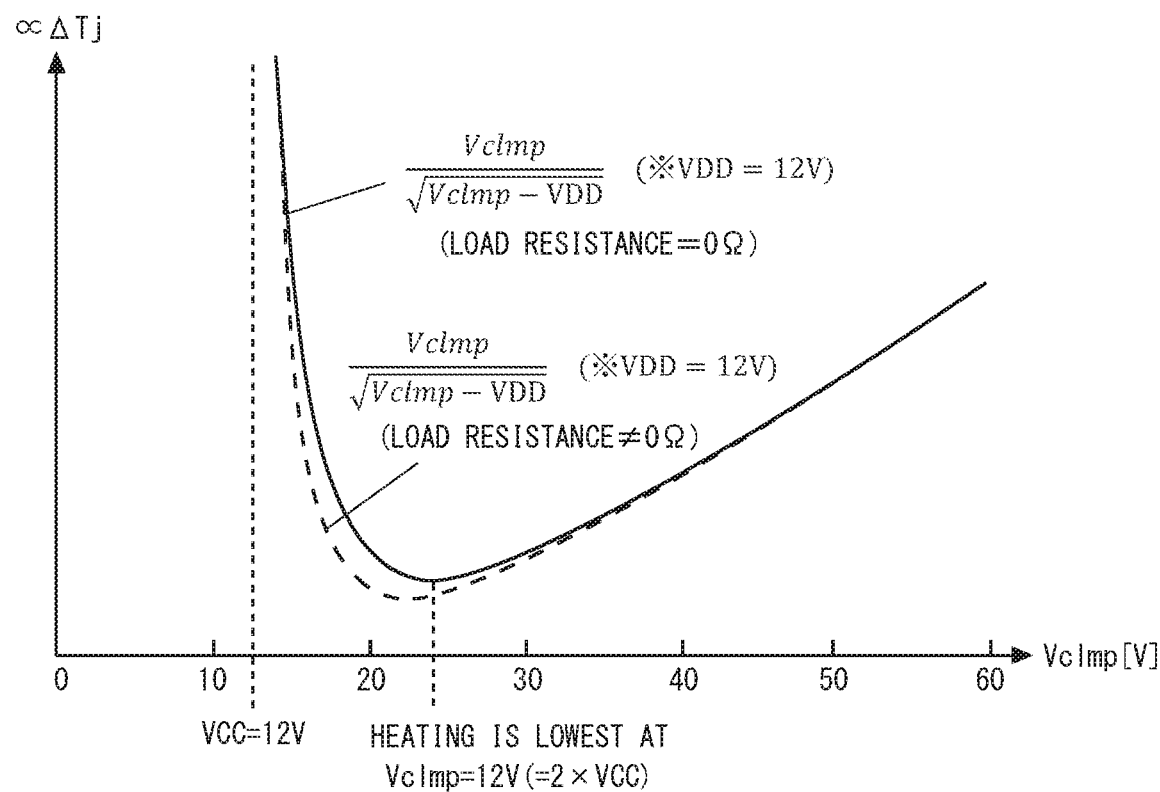
FIG. 16 is a graph illustrating a clamp voltage that is set in the semiconductor device according to the fifth embodiment.

FIG. 16 is a graph illustrating a clamp voltage that is set in the semiconductor device according to the fifth embodiment. The relationship between a temperature change and the clamp voltage Vclmp in FIG. 3 described in the first embodiment is an ideal state where a load resistance is 0Ω. However, the resistance component of the load circuit RL is actually not 0Ω. In this case, the clamp voltage Vclmp at which the junction temperature of the semiconductor chip is the lowest can be deviated from twice the power supply voltage VDD.

In the case where the deviation as shown in FIG. 16 occurs, it is necessary to make fine adjustments of the reference current Iref. When the need for such adjustments arises, the semiconductor device 5 according to the fifth embodiment changes the mirror ratio of the current mirror composed of the NMOS transistors 26 and 27 by changing the number of NMOS transistors 261 to 26n that function effectively. By changing the mirror ratio, the semiconductor device 5 according to the fifth embodiment makes fine adjustments of the reference current Iref.

In this manner, in the semiconductor device 5 according to the fifth embodiment, it is possible to eliminate a deviation of the clamp voltage Vclmp at which the junction temperature is the lowest in accordance with the resistance component of the load circuit RL and thereby increase the accuracy of minimizing the junction temperature in the clamp time.

Sixth Embodiment

Figure 17:
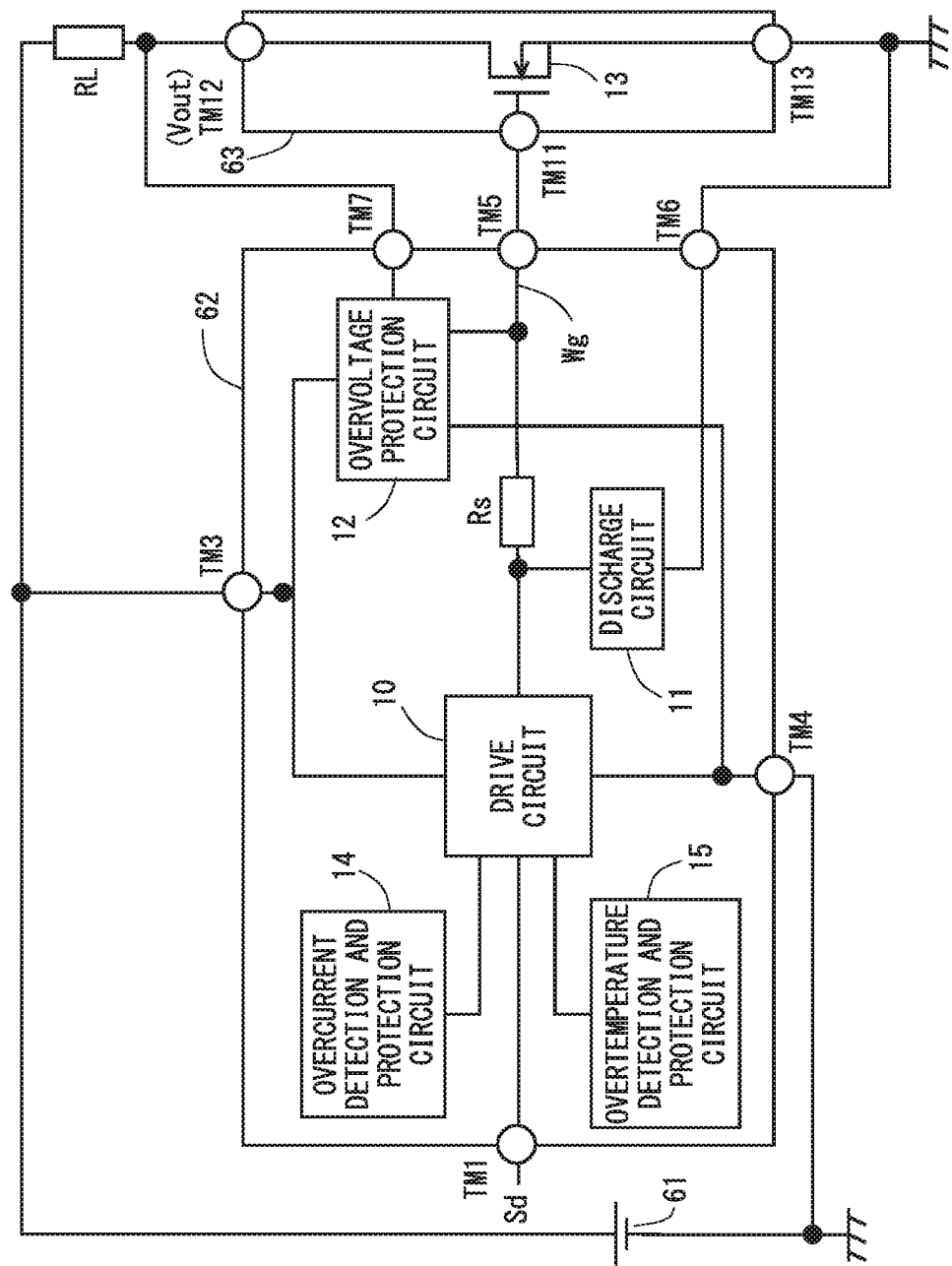
FIG. 17 is a block diagram of a semiconductor device according to a sixth embodiment.

In a sixth embodiment, a semiconductor device 6 where the output transistor 13 of the semiconductor device 1 according to the first embodiment is placed as an individual semiconductor chip is described. FIG. 17 is the block diagram of the semiconductor device 6 according to the sixth embodiment. Note that, in the description of the sixth embodiment, the same elements as those described in the first embodiment are denoted by the same reference numerals as in the first embodiment and not redundantly described.

As shown in FIG. 17, the semiconductor device 6 according to the sixth embodiment includes a battery 61, a control chip 62 and a power MOS chip 63. The battery 61 supplies power to the control chip 62 and the power MOS chip 63. On the control chip 62, the circuit of the semiconductor device 1 excluding the output transistor 13 is formed. Further, on the control chip 62, an overcurrent detection and protection circuit 14 and an overtemperature detection and protection circuit 15 are formed. The overcurrent detection and protection circuit 14 gives an instruction to the drive circuit 10 to shut off the output transistor 13 when an overcurrent detection circuit that is placed outside the power MOS chip 63 detects that a current flowing through the output transistor 13 is in the overcurrent state. The overtemperature detection and protection circuit 15 gives an instruction to the drive circuit 10 to shut off the output transistor 13 when a temperature sensor that is placed outside the power MOS chip 63 detects that the power MOS chip 63 is in the overtemperature state.

Further, since the output transistor 13 is placed as a separate semiconductor chip, a gate output terminal TM5, a source-side connection terminal TM6, and a drain-side connection terminal TM7 are placed on the control chip 62, in addition to the input terminal TM1, the power supply terminal TM3 and the ground terminal TM4. The gate output terminal TM5 is a terminal that is placed in place of the output terminal TM2, and it is a terminal for connecting the gate of the output transistor 13 that is placed on the power MOS chip 63. The gate wire Wg that is placed on the control chip 62 is connected to the gate output terminal TM5. The source-side connection terminal TM6 is a terminal for connecting the source of the output transistor 13. Further, the discharge circuit 11 on the control chip 62 is connected to the source-side connection terminal TM6. The drain-side connection terminal TM7 is an output voltage detection terminal, and it is a terminal for connecting the drain of the output transistor 13. Further, the drain-side connection terminal TM7 is used to input an output voltage to the overvoltage protection circuit 12 on the control chip 62.

The output transistor 13 is formed on the power MOS chip 63. A gate input terminal TM11, a drain terminal TM12, and a source terminal TM13 are placed on the power MOS chip 63. The gate input terminal TM11 is an external terminal to be connected to the gate of the output transistor 13. The drain terminal TM12 is an external terminal to be connected to the drain of the output transistor 13. The source terminal TM13 is an external terminal to be connected to the source of the output transistor 13.

In this manner, even when the output transistor 13 is placed on a semiconductor chip that is different from the other circuit block, the same circuit as the semiconductor device 1 according to the first embodiment can be configured by preparing necessary terminals such as the gate output terminal TM5, the source-side connection terminal TM6, and the drain-side connection terminal TM7 as external terminals.

Seventh Embodiment

Figure 18:
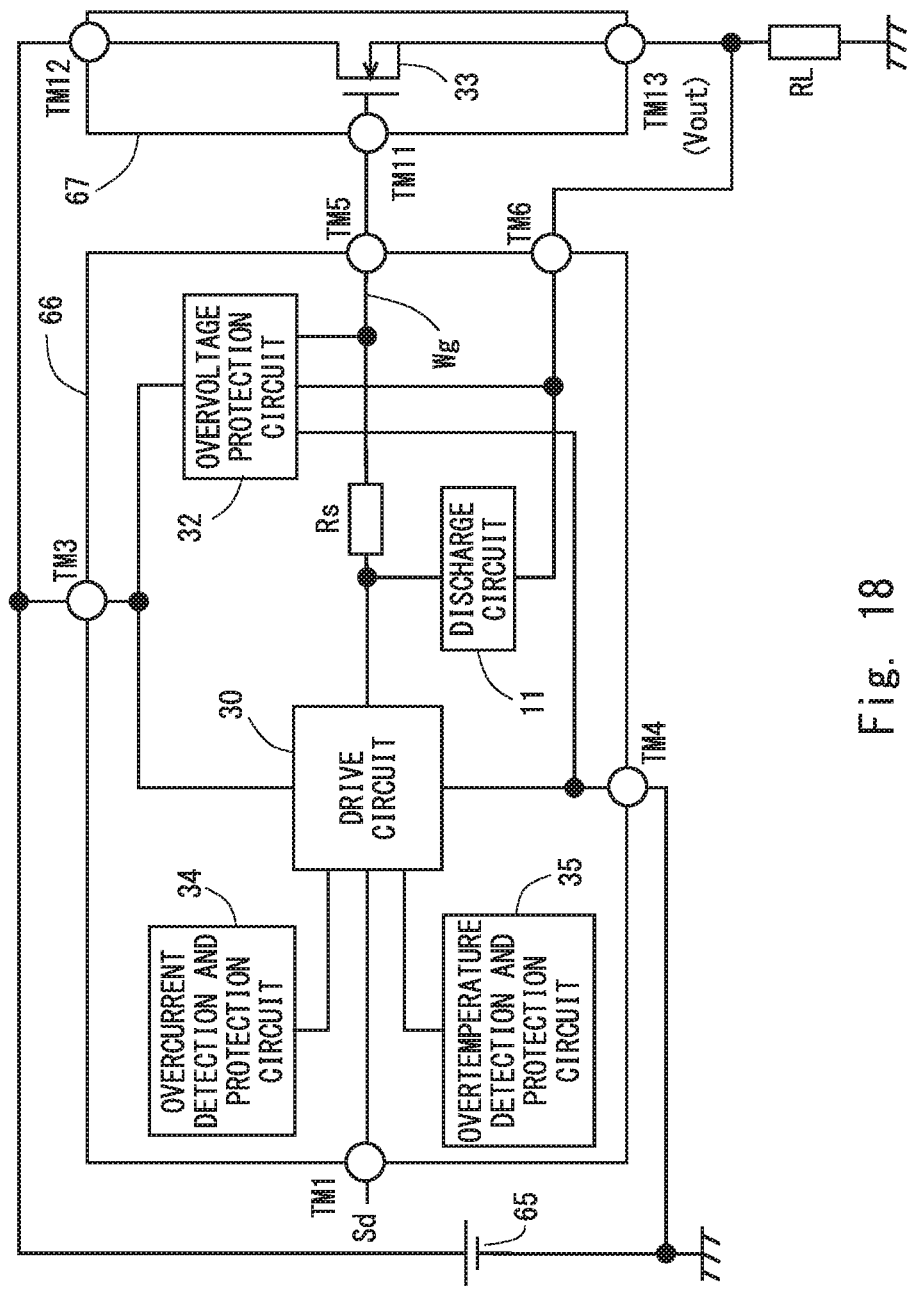
FIG. 18 is a block diagram of a semiconductor device according to a seventh embodiment.

In a seventh embodiment, a semiconductor device 7 where the output transistor 33 of the semiconductor device 4 according to the fourth embodiment is placed as an individual semiconductor chip is described. FIG. 18 is the block diagram of the semiconductor device 7 according to the seventh embodiment. Note that, in the description of the seventh embodiment, the same elements as those described in the fourth embodiment are denoted by the same reference numerals as in the fourth embodiment and not redundantly described.

As shown in FIG. 18, the semiconductor device 7 according to the seventh embodiment includes a battery 65, a control chip 66 and a power MOS chip 67. The battery 65 supplies power to the control chip 66 and the power MOS chip 67. On the control chip 65, the circuit of the semiconductor device 4 excluding the output transistor 33 is formed. Further, on the control chip 65, an overcurrent detection and protection circuit 34 and an overtemperature detection and protection circuit 35 are formed. The overcurrent detection and protection circuit 34 gives an instruction to the drive circuit 30 to shut off the output transistor 33 when an overcurrent detection circuit that is placed outside the power MOS chip 67 detects that a current flowing through the output transistor 33 is in the overcurrent state. The overtemperature detection and protection circuit 35 gives an instruction to the drive circuit 30 to shut off the output transistor 33 when a temperature sensor that is placed outside the power MOS chip 67 detects that the power MOS chip 67 is in the overtemperature state.

Further, since the output transistor 33 is placed as a separate semiconductor chip, a gate output terminal TM5 and a source-side connection terminal TM6 are placed on the control chip 66, in addition to the input terminal TM1, the power supply terminal TM3 and the ground terminal TM4. The gate output terminal TM5 is a terminal that is placed in place of the output terminal TM2, and it is a terminal for connecting the gate of the output transistor 33 that is placed on the power MOS chip 67. The gate wire Wg that is placed on the control chip 66 is connected to the gate output terminal TM5. The source-side connection terminal TM6 is a terminal for connecting the source of the output transistor 33. Further, source-side connection terminal TM6 is used as an output voltage detection terminal. In addition, the discharge circuit 31 and the overvoltage protection circuit 32 on the control chip 66 are connected to the source-side connection terminal TM6.

The output transistor 33 is formed on the power MOS chip 67. A gate input terminal TM11, a drain terminal TM12, and a source terminal TM13 are placed on the power MOS chip 67. The gate input terminal TM11 is an external terminal to be connected to the gate of the output transistor 33. The drain terminal TM12 is an external terminal to be connected to the drain of the output transistor 33. The source terminal TM13 is an external terminal to be connected to the source of the output transistor 33.

In this manner, even when the output transistor 33 is placed on a semiconductor chip that is different from the other circuit block, the same circuit as the semiconductor device 4 according to the fourth embodiment can be configured by preparing necessary terminals such as the gate output terminal TM5 and the source-side connection terminal TM6 as external terminals.

Eighth Embodiment

Figure 19:
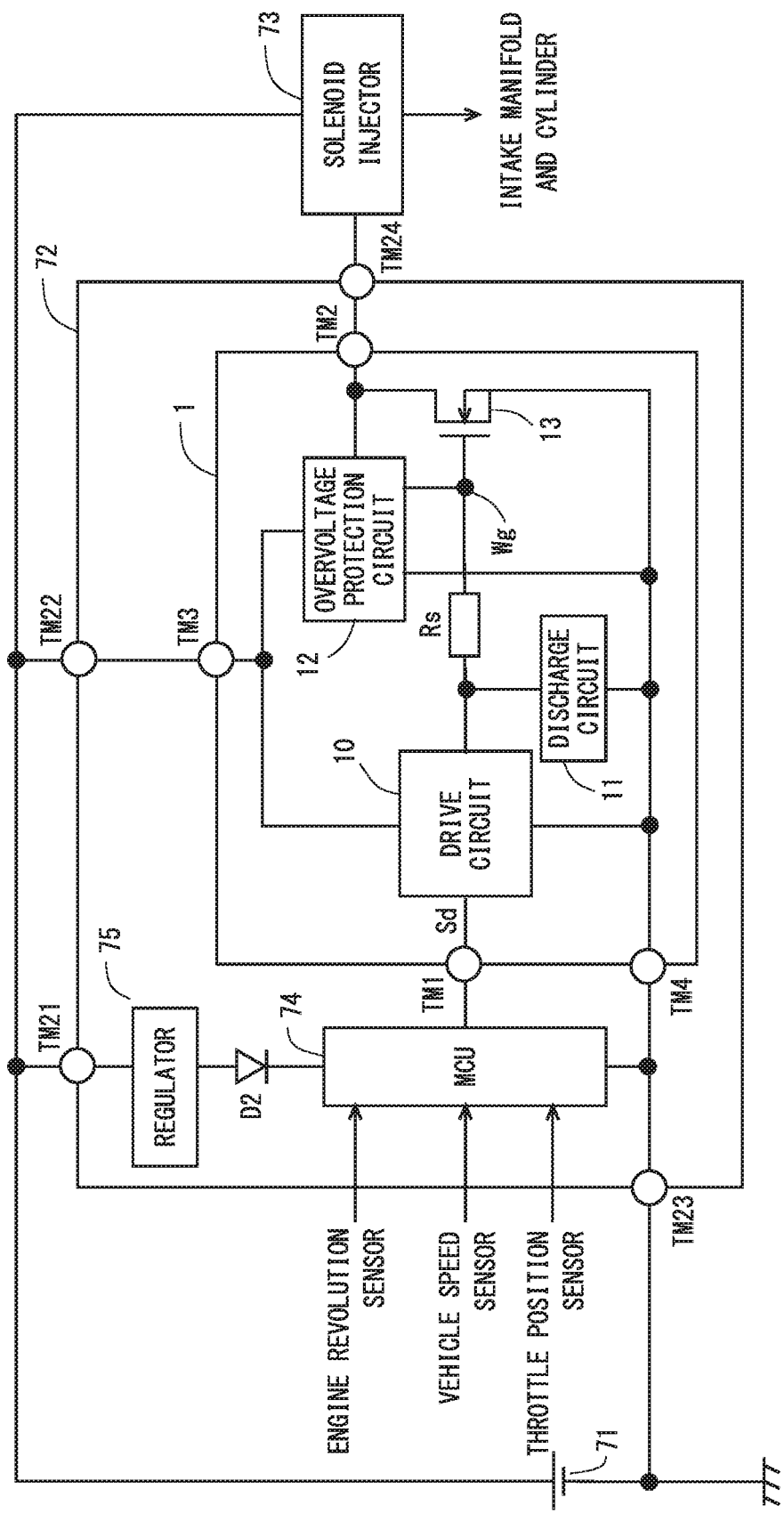
FIG. 19 is a block diagram of a semiconductor device according to an eighth embodiment.

In an eighth embodiment, a first example of use of the semiconductor device 1 according to the first embodiment is described. FIG. 19 is a block diagram of a semiconductor device 8 according to the eighth embodiment. Note that, in the description of the eighth embodiment, the same elements as those described in the first embodiment are denoted by the same reference numerals as in the first embodiment and not redundantly described.

The semiconductor device 8 according to the eighth embodiment is an electronic control unit (which is referred to as ECU) 72 of an injector system that injects gasoline to a cylinder by switching a power supply state to a solenoid that serves as an inductive load.

As shown in FIG. 19, in the semiconductor device 8, the semiconductor device 1 is used as one part that constitutes the ECU 72. In the semiconductor device 8, a regulator 75, a diode D2 and an MCU 74 are placed on the ECU 72, and the semiconductor device 1 is controlled by the MCU 74. Further, detection signals from an engine revolution sensor, a vehicle speed sensor and a throttle position sensor are input to the MCU 74. The MCU 74 controls the output transistor 13 in response to the input from those sensors and thereby causes a solenoid injector 73 to operate. Further, in the example of FIG. 19, a battery 71 that supplies power to the ECU 72 and the solenoid injector 73 is shown. Further, in the ECU 72, operating power to the MCU 74 is generated by stepping down a power supply voltage that is supplied from the battery 71 by using the regulator 75 and the diode D2.

In this manner, by using the semiconductor device 1 for control of the solenoid injector 73 that includes an inductive load, it is possible to suppress the variation of the junction temperature of the semiconductor device 1 which is caused by a voltage rise that occurs due to the back electromotive force of the inductive load.

Ninth Embodiment

Figure 20:
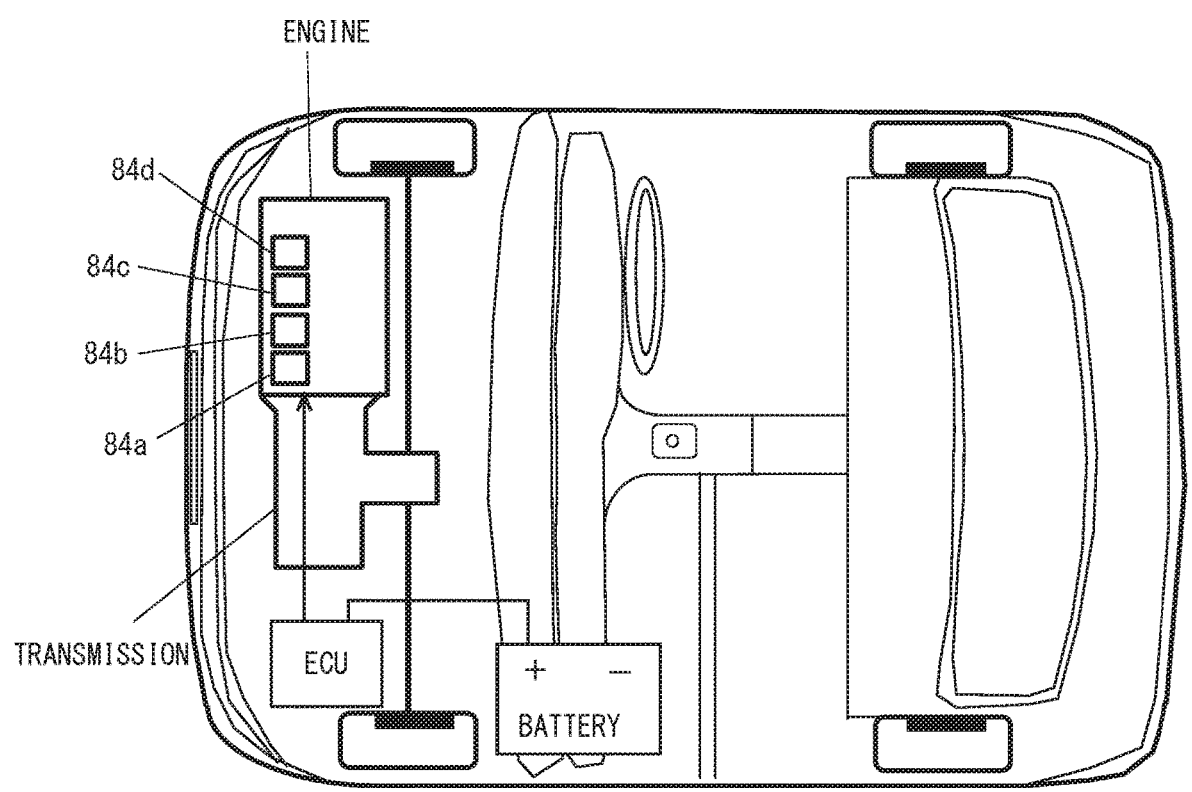
FIG. 20 is a block diagram illustrating an application example of a semiconductor device according to a ninth embodiment.

In a ninth embodiment, a second example of use of the semiconductor device 1 according to the first embodiment is described. FIG. 20 is a block diagram of a vehicle, which is an application example of a semiconductor device 9 according to the ninth embodiment. As shown in FIG. 20, a multicylinder (e.g., four-cylinder) engine is mounted on the vehicle. In this four-cylinder engine, a solenoid injector 84 (e.g., solenoid injectors 84a to 84d) is placed for each cylinder. Further, in the vehicle, the solenoid injector 84 is controlled using one electronic control unit (which is referred to as ECU). The ECU receives power supply from the battery that is mounted on the vehicle.

Figure 21:
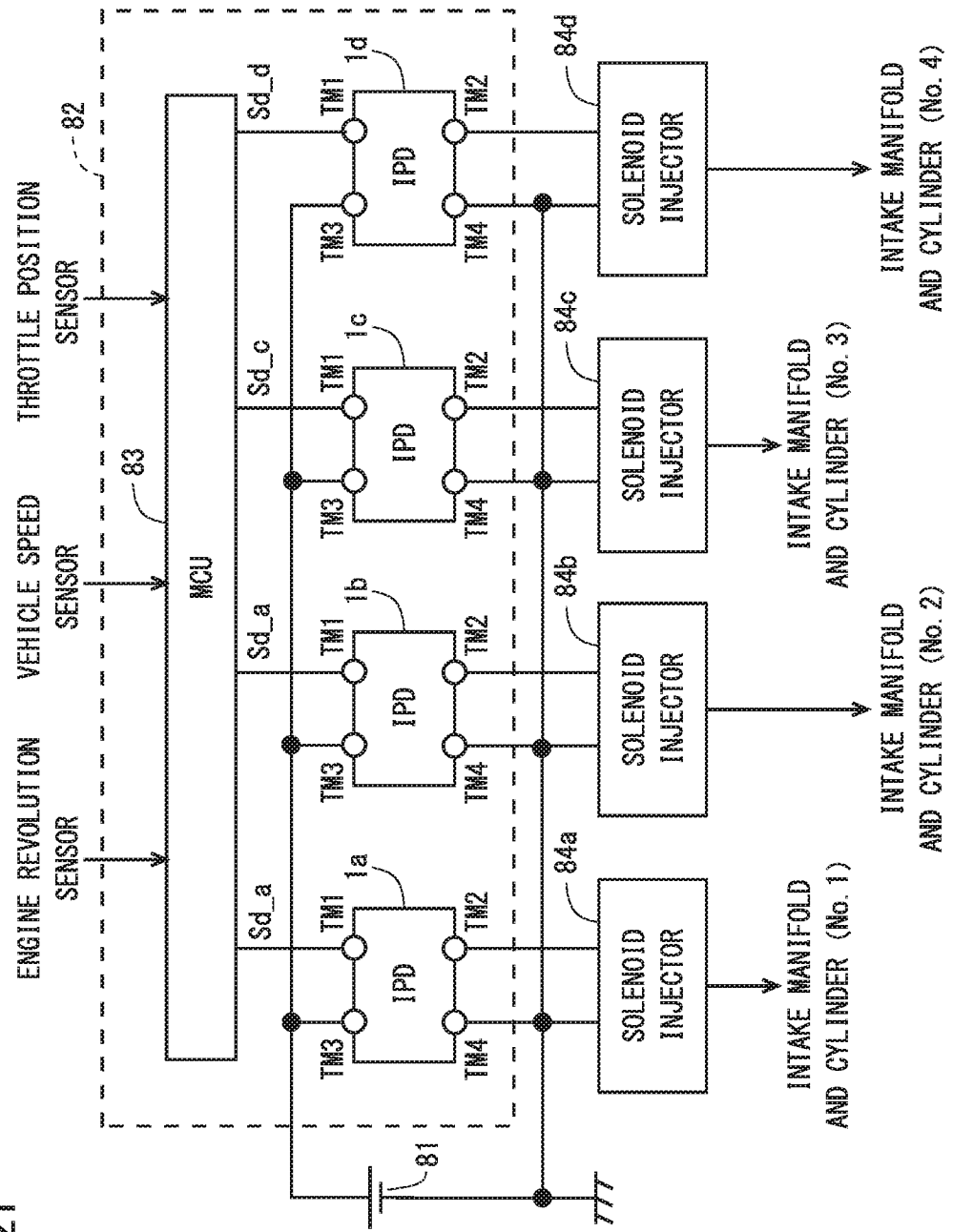
FIG. 21 is a block diagram of the semiconductor device according to the ninth embodiment.

FIG. 21 is a block diagram of the semiconductor device 9 according to the ninth embodiment. Note that, in the description of the ninth embodiment, the same elements as those described in the first embodiment are denoted by the same reference numerals as in the first embodiment and not redundantly described.

The semiconductor device 9 according to the ninth embodiment is an electronic control unit (which is referred to as ECU) 82 of an injector system that injects gasoline to a cylinder by switching a power supply state to a solenoid that serves as an inductive load. In this ECU 82, semiconductor devices 1a to 1d are mounted to individually control the solenoid injectors 84a to 84d placed corresponding to the cylinders. Each of the semiconductor devices 1a to 1d is the semiconductor device 1 that is described in the first embodiment.

In the ECU 82, the semiconductor devices 1a to 1d are controlled by one MCU 83. Further, detection signals from an engine revolution sensor, a vehicle speed sensor and a throttle position sensor are input to the MCU 83. The MCU 83 controls the output transistor 13 in response to the input from those sensors and thereby causes the solenoid injectors 84a to 84d to operate. Further, in the example of FIG. 21, a battery 81 that supplies power to the semiconductor devices 1a to 1d in the ECU 82 and the solenoid injectors 84a to 84d is shown.

In this manner, by using the semiconductor device 1 for control of the solenoid injectors 84a to 84d that include an inductive load, it is possible to suppress the variation of the junction temperature of the semiconductor device 1 which is caused by a voltage rise that occurs due to the back electromotive force of the inductive load.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first to ninth embodiments can be combined as desirable by one of ordinary skill in the art.

What is claimed is:

1. A semiconductor device comprising:
   a first power supply terminal that is supplied with a first power supply;

a second power supply terminal that is supplied with second power supply;

an output voltage detection terminal to which another end of a load circuit is connected, one end of the load circuit being connected to the first power supply terminal;

a gate wire that is connected to a gate of an output transistor connected between the another end of the load circuit and the second power supply terminal;

a drive circuit that controls the output transistor; and an overvoltage protection circuit that controls the output transistor based on a voltage difference between the second power supply terminal and the output voltage detection terminal, wherein the overvoltage protection circuit includes
- a first current source that generates a reference current having a value proportional to a voltage difference between the first power supply and the second power supply,
- a second current source that generates a comparative current based on a voltage difference between the second power supply terminal and the output voltage detection terminal, and
- an overvoltage protection transistor that supplies, to the gate wire, an overvoltage protection current having a value dependent on a current difference between the reference current and the comparative current.

2. The semiconductor device according to claim 1, wherein the reference current is set to approximately twice the comparative current in a state where a voltage difference between the output voltage detection terminal and the second power supply terminal is the same as a voltage of the first power supply.

3. The semiconductor device according to claim 1, wherein the first current source includes
- a reference current setting resistor with one end connected to the second power supply terminal,
- a first transistor with a drain connected to another end of the reference current setting resistor, source connected to the first power supply terminal, and a gate and a drain connected to each other, and
- a second transistor with a source connected to the first power supply terminal, a drain connected to a gate of the overvoltage protection transistor, and a gate connected in common to the gate of the first transistor, the second current source includes
- a comparative current setting resistor with one end connected to the output voltage detection terminal,
- a third transistor with a drain connected to another end of the comparative current setting resistor, source connected to the second power supply terminal, and gate and a drain connected to each other, and
- a fourth transistor with a source connected to the second power supply terminal, a drain connected to a gate of the overvoltage protection transistor, and a gate connected in common to the gate of the third transistor, and the overvoltage protection transistor has a drain connected to the gate wire, and a source connected to the first power supply terminal.

4. The semiconductor device according to claim 3, comprising:
a diode with an anode connected to the another end of the comparative current setting resistor, and a cathode connected to the drain of the third transistor.

5. The semiconductor device according to claim 1, wherein the first current source includes
- a reference current setting resistor with one end connected to the first power supply terminal,
- a first transistor with a drain connected to another end of the reference current setting resistor, source connected to the second power supply terminal, and gate and a drain connected to each other,
- a second transistor with a source connected to the second power supply terminal, and a gate connected in common to the gate of the first transistor,
- a third transistor with a drain connected to a drain of the second transistor, a source connected to the first power supply terminal, and a gate and a drain connected to each other, and
- a fourth transistor with a source connected to the first power supply terminal, a drain connected to a gate of the overvoltage protection transistor, and a gate connected in common to the gate of the third transistor, the second current source includes
- a comparative current setting resistor with one end connected to the output voltage detection terminal,
- a fifth transistor with a drain connected to another end of the comparative current setting resistor, source connected to the second power supply terminal, and gate and a drain connected to each other, and
- a sixth transistor with a source connected to the second power supply terminal, a drain connected to a gate of the overvoltage protection transistor, and a gate connected in common to the gate of the fifth transistor, and the overvoltage protection transistor has a drain connected to the gate wire, and a source connected to the first power supply terminal.

6. The semiconductor device according to claim 5, comprising:
a diode with an anode connected to the another end the comparative current setting resistor, and a cathode connected to the drain of the fifth transistor.

7. The semiconductor device according to claim 1, wherein the first current source includes
- a reference current setting resistor with one end connected to the first power supply terminal,
- a first transistor with a drain connected to another end of the reference current setting resistor, source connected to the second power supply terminal, and gate and a drain connected to each other, and
- a second transistor with a source connected to the second power supply terminal, a gate connected in common to the gate of the first transistor, and a drain connected to a gate of the overvoltage protection transistor, the second current source includes
- a comparative current setting resistor with one end connected to the output voltage detection terminal,
- a third transistor with a drain connected to another end of the comparative current setting resistor, source connected to the second power supply terminal, and gate and a drain connected to each other,
- a fourth transistor with a source connected to the second power supply terminal, and a gate connected in common to the gate of the third transistor, and a fifth transistor with a source connected to the first power supply terminal, drain connected to a drain of the fourth transistor, and a gate and a drain connected to each other, and a sixth transistor with a source connected to the first power supply terminal, a gate connected in common to the gate of the fifth transistor, and a drain connected to a gate of the overvoltage protection transistor, and the overvoltage protection transistor has a drain connected to the gate wire, and a source connected to the first power supply terminal.

8. The semiconductor device according to claim 7, comprising:

a diode with an anode connected to the another end of the comparative current setting resistor, and a cathode connected to the drain of the third transistor.

9. The semiconductor device according to claim 7, comprising:

a backflow prevention diode that is connected between the drain of the overvoltage protection transistor and the gate wire.

10. The semiconductor device according to claim 1, comprising:

a resistor that stores a current adjustment value supplied externally, wherein the first current source makes fine adjustments of a value of the reference current based on the current adjustment value.

11. The semiconductor device according to claim 1, comprising:

a gate discharge transistor that is connected between the gate wire and the source of the output transistor.

12. The semiconductor device according to claim 1, wherein the output transistor is formed on the same semiconductor substrate as the overvoltage protection circuit.

13. The semiconductor device according to claim 1, wherein the load circuit includes an inductive load.

14. A semiconductor device comprising:

a first power supply terminal that is supplied with a first power supply;

a second power supply terminal that is supplied with a second power supply;

an output voltage detection terminal to which another end of a load circuit is connected, one end of the load circuit being connected to the first power supply terminal;

a gate wire that is connected to a gate of an output transistor connected between the another end of the load circuit and the second power supply terminal;

a drive circuit that controls the output transistor; and an overvoltage protection circuit that controls the output transistor to be conductive when a voltage difference between the second power supply terminal and the output voltage detection terminal reaches a clamp voltage that is set to be proportional to a voltage difference between the first power supply and the second power supply in a state where the output transistor is controlled to be cut off, wherein the clamp voltage is set to a voltage when a voltage difference between the second power supply terminal and the output voltage detection terminal is approximately twice a voltage difference between the first power supply and the second power supply.

* * * * *